US 12,396,358 B2

(12) United States Patent
Son et al.

(10) Patent No.: US 12,396,358 B2
(45) Date of Patent: Aug. 19, 2025

(54) DISPLAY APPARATUS

(71) Applicant: Samsung Display Co., Ltd., Yongin-si (KR)

(72) Inventors: Jongho Son, Yongin-si (KR); Daewon Kim, Yongin-si (KR); Sujeong Kim, Yongin-si (KR); Jinhyeong Lee, Yongin-si (KR); Jiyoon Jung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 518 days.

(21) Appl. No.: 17/956,082

(22) Filed: Sep. 29, 2022

(65) Prior Publication Data

US 2023/0225154 A1 Jul. 13, 2023

(30) Foreign Application Priority Data

Jan. 10, 2022 (KR) .................. 10-2022-0003618

(51) Int. Cl.
*H10K 50/86* (2023.01)
*H10K 50/813* (2023.01)
*H10K 59/122* (2023.01)

(52) U.S. Cl.
CPC ......... *H10K 50/865* (2023.02); *H10K 50/813* (2023.02); *H10K 59/122* (2023.02)

(58) Field of Classification Search
CPC . H10K 50/865; H10K 50/813; H10K 59/8792
USPC ........................................... 257/40
See application file for complete search history.

(56) References Cited

U.S. PATENT DOCUMENTS

| | | | |
|---|---|---|---|
| 9,854,209 B2 | 12/2017 | Aich et al. | |
| 10,272,839 B2 | 4/2019 | Lynam et al. | |
| 10,427,604 B2 | 10/2019 | Schofield et al. | |
| 11,075,364 B2 | 7/2021 | Kim et al. | |
| 2021/0036263 A1 | 2/2021 | Kim et al. | |
| 2021/0104708 A1* | 4/2021 | Fukuoka | H10K 71/00 |

FOREIGN PATENT DOCUMENTS

| | | |
|---|---|---|
| JP | 5520058 B2 | 4/2014 |
| KR | 1020200063591 A | 6/2020 |
| KR | 1020210016233 A | 2/2021 |

* cited by examiner

*Primary Examiner* — Quoc D Hoang
(74) *Attorney, Agent, or Firm* — CANTOR COLBURN LLP

(57) ABSTRACT

A display apparatus includes a display element layer including a plurality of emission areas each having a length in a direction, an encapsulation layer over the display element layer, and a light-shielding pattern layer over the encapsulation layer, and defining a plurality of holes respectively corresponding to the plurality of emission areas and spaced apart from each other along the direction by a distance along the direction. A distance from the upper surface of the display element layer at the emission area, to the upper surface of the light-shielding pattern layer, along a thickness direction of the display apparatus, is about 2.6 to about 2.8 times the length of the emission area, and the distance between the plurality of holes of the light-shielding pattern layer is about 1.5 to about 1.7 times the length of the emission area.

20 Claims, 15 Drawing Sheets

DISPLAY APPARATUS

This application claims priority to Korean Patent Application No. 10-2022-0003618, filed on Jan. 10, 2022, and all the benefits accruing therefrom under 35 U.S.C. § 119, the disclosure of which is incorporated by reference herein in its entirety.

BACKGROUND

1. Field

One or more embodiments relate to display apparatuses.

2. Description of the Related Art

As the demand for display apparatuses increases, various purposes for display apparatuses has also increased. According to this trend, display apparatuses have gradually become larger and thinner. As display apparatuses are increasingly used in various fields, demands for display apparatuses capable of providing high-quality images have increased.

SUMMARY

One or more embodiments include a display apparatus in which a vertical viewing angle is limited to prevent light emitted from the display apparatus from being reflected by an object in an external environment, such as reflection of light by a window of a vehicle and obstructing a driver's view. However, the one or more embodiments are only examples, and the scope of the present disclosure is not limited thereto.

Additional aspects will be set forth in part in the description that follows and, in part, will be apparent from the description, or may be learned by practice of the presented embodiments of the present disclosure.

According to an embodiment, a display apparatus includes a substrate, a display element layer which is over the substrate and includes a plurality of emission areas having a first length in a first direction and a second length in a second direction crossing (e.g., perpendicular) to the first direction, an encapsulation layer over the display element layer, a light-shielding pattern which is over the encapsulation layer and has (or defines) a plurality of holes respectively overlapping the plurality of emission areas, where a first distance from an upper surface of the emission area to an upper surface of the light-shielding pattern, is about 2.6 to about 2.8 times the second length, and a second distance between holes neighboring each other in the second direction, from among the plurality of holes, is about 1.5 to about 1.7 times the second length.

A thickness of the light-shielding pattern may be greater than about 0.8 times the second distance.

The first length may be greater than the second length.

The first length may be greater than about three times the second length.

The display element layer may further include a pixel electrode, a pixel-defining layer which is over the pixel electrode and has a plurality of openings respectively corresponding to the plurality of emission areas, an emission layer over the pixel electrode, and an opposite electrode over the emission layer, where the pixel electrode overlaps the plurality of openings.

The plurality of openings may be located within an edge of the pixel electrode, in a plan view.

The pixel electrode may be provided in plurality, the plurality of pixel electrodes may include a first pixel electrode and a second pixel electrode which is spaced apart from the first pixel electrode in the first direction, the plurality of openings may include a first opening overlapping the first pixel electrode and a second opening overlapping the second pixel electrode, and a first hole (e.g., same one hole) that is one of the plurality of holes may overlap both the first opening and the second opening.

The pixel electrode may include a connection portion extending in the second direction, and a plurality of protrusions protruding from the connection portion and extending in the first direction (e.g., a comb-shape), and the plurality of openings may overlap the plurality of protrusions, respectively.

The display apparatus may further include a light-transmitting layer which is over the light-shielding pattern and buries the plurality of holes, where a refractive index of the light-transmitting layer is about 1.4 to about 1.5.

The light-shielding pattern may include a plurality of sub-patterns overlapping each other in a plan view, with a light-transmitting layer therebetween.

According to an embodiment, a display apparatus includes a substrate, a display element layer which is over the substrate and includes a plurality of emission areas having a first length in a first direction and a second length in a second direction perpendicular to the first direction, an encapsulation substrate over the display element to face the substrate, a light-shielding pattern which is on a lower surface of the encapsulation layer and has a plurality of holes respectively overlapping the plurality of emission areas, and a filler between the display element layer and the encapsulation substrate, where a first distance from an upper surface of the emission area to an upper surface of the light-shielding pattern, is about 2.6 to about 2.8 times the second length, and a second distance between holes neighboring each other in the second direction from among the plurality of holes, is about 1.5 to about 1.7 times the second length.

A thickness of the light-shielding pattern may be greater than about 0.8 times the second distance.

The first length may be greater than the second length.

The first length may be greater than about three times the second length.

The display element layer may further include a pixel electrode, a pixel-defining layer which is over the pixel electrode and has a plurality of openings respectively corresponding to the plurality of emission areas, an emission layer over the pixel electrode, and an opposite electrode over the emission layer, where the pixel electrode overlaps the plurality of openings.

In a plan view, the plurality of openings may be located within an edge of the pixel electrode and arranged spaced apart from each other in the second direction.

The pixel electrode may be provided in plurality, the plurality of pixel electrodes may include a first pixel electrode and a second pixel electrode apart from the first pixel electrode in the first direction, the plurality of openings may include a first opening overlapping the first pixel electrode and a second opening overlapping the second pixel electrode, and a first hole that is one of the plurality of holes may overlap the first opening and the second opening.

The pixel electrode may include a connection portion extending in the second direction, and a plurality of protrusions protruding from the connection portion and extending in the first direction, and the plurality of openings may overlap the plurality of protrusions, respectively.

A refractive index of the filler may be about 1.4 to about 1.5.

The light-shielding pattern may include a plurality of sub-patterns overlapping each other in a plan view with a light-transmitting layer therebetween.

These and/or other aspects will become apparent and more readily appreciated from the following detailed description of the embodiments, the accompanying drawings, and claims.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
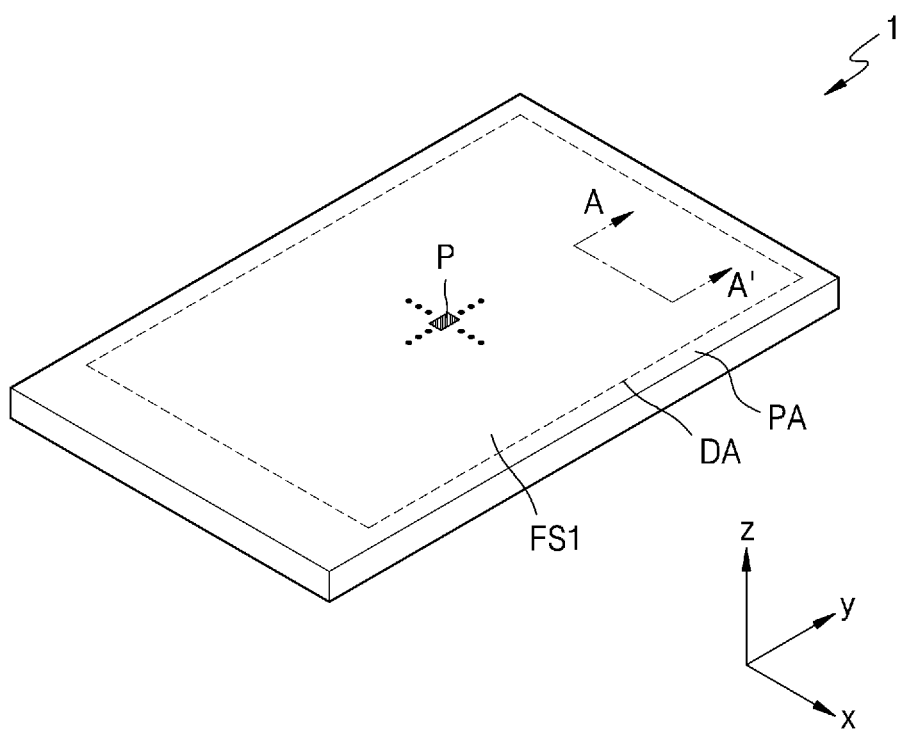
FIG. 1 is a perspective view schematically illustrating a display apparatus according to an embodiment.

Reference will now be made in detail to embodiments, examples of which are illustrated in the accompanying drawings, where like reference numerals refer to like elements throughout the present disclosure. In this regard, the present embodiments may have different forms and should not be construed as being limited to the descriptions set forth herein. Accordingly, the embodiments are merely described below, by referring to the figures, to explain aspects of the present disclosure.

As used herein, the term "and/or" includes any and all combinations of one or more of the associated listed items. The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. Throughout the disclosure, the expression "at least one of a, b or c" indicates only a, only b, only c, both a and b, both a and c, both b and c, all of a, b, and c, or any variations thereof.

As the present disclosure allows for various changes and numerous embodiments, certain embodiments will be illustrated in the drawings and described in detail in the written description. Hereinafter, effects and features of the present disclosure and a method for accomplishing them will be described more fully with reference to the accompanying drawings, in which embodiments of the present disclosure are shown. This disclosure may, however, be embodied in many different forms and should not be construed as limited to the embodiments set forth herein.

Hereinafter, embodiments will be described with reference to the accompanying drawings, where like reference numerals refer to like elements throughout the present disclosure and a repeated description thereof is omitted. As used herein, a reference number may indicate a singular element or a plurality of the element. For example, a reference number labeling a singular form of an element within the drawing figures may be used to reference a plurality of the singular element within the text of specification.

In an embodiment below, terms such as "first" and "second" are used herein merely to describe a variety of elements, but the elements are not limited by the terms. Such terms are used only for the purpose of distinguishing one element from another element.

As used herein, the singular forms "a," "an," and "the" are intended to include the plural forms as well, unless the context clearly indicates otherwise.

It will be understood that terms such as "comprise," "include," and "have" used herein specify the presence of stated features or elements, but do not preclude the presence or addition of one or more other features or elements.

It will be understood that when a layer, region, or component is referred to as being related to another element such as being "on" another layer, region, or component, it can be directly or indirectly formed on the other layer, region, or component. That is, for example, intervening layers, regions, or components may be present. In contrast, when a layer, region, or component is referred to as being related to another element such as being "directly on" another layer, region, or component, no intervening layer, region or component is present.

It will be understood that when a layer, region, or component is referred to as being "connected" to another layer, region, or component, it may be "directly connected" to the other layer, region, or component or may be "indirectly connected" to the other layer, region, or component with other layer, region, or component located therebetween. For example, it will be understood that when a layer, region, or component is referred to as being "electrically connected" to another layer, region, or component, it may be "directly electrically connected" to the other layer, region, or component and/or may be "indirectly electrically connected" to other layer, region, or component with other layer, region, or component interposed therebetween.

In the present specification, "A and/or B" means A or B, or A and B. In addition, "at least one of A and B" means A or B, or A and B.

In the following embodiments, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

When an embodiment may be implemented differently, a certain process order may be performed differently from the described order. For example, two consecutively described processes may be performed substantially at the same time or performed in an order opposite to the described order.

Sizes of elements in the drawings may be exaggerated for convenience of explanation. For example, because sizes and thicknesses of elements in the drawings are arbitrarily illustrated for convenience of explanation, the present disclosure is not limited thereto.

Figure 2:
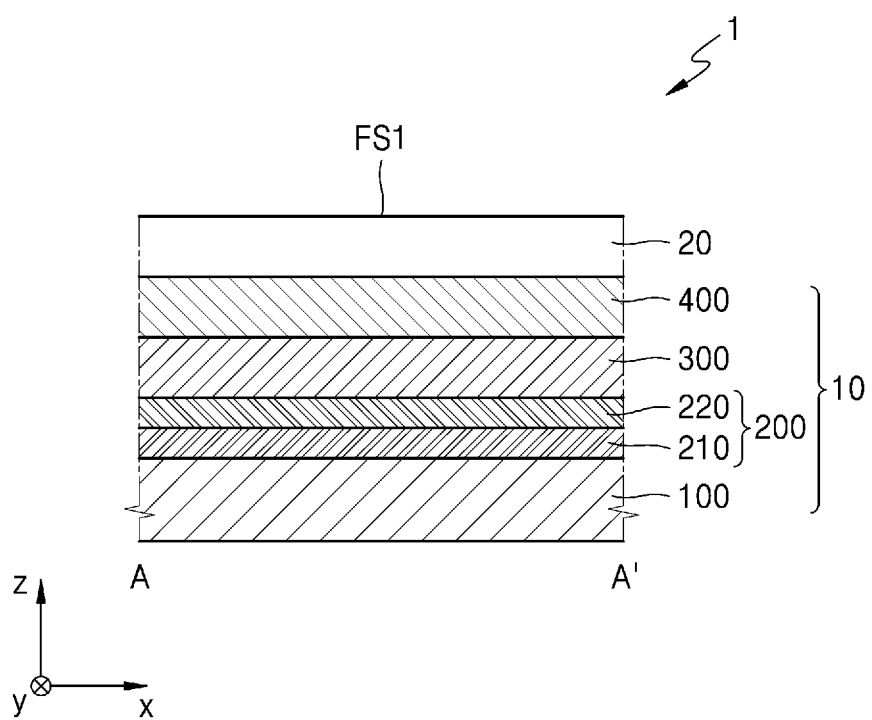
FIG. 2 is a cross-sectional view of the display apparatus in FIG. 1, taken along line A-A' in FIG. 1.

FIG. 1 is a perspective view schematically illustrating a display apparatus 1 according to an embodiment, and FIG. 2 is a cross-sectional view of the display apparatus 1 in FIG. 1, taken along line A-A' in FIG. 1.

Referring to FIG. 1, the display apparatus 1 according to an embodiment may include a display area DA and a peripheral area PA. The peripheral area PA may be arranged outside the display area DA, and adjacent to the display area DA, such as to surround the display area DA. In the peripheral area PA, various wirings and driving circuit units configured to transmit electrical signals to the display area DA may be located. The display apparatus 1 may provide an image by using light emitted from a pixel P provided in plural including a plurality of pixels P arranged in the display area DA. The display apparatus 1 may be disposed in a plane defined by a first direction and a second direction which cross each other. A thickness of the display apparatus 1 and various components or layers thereof may be defined along a third direction crossing each of the first and second directions. The various components and layers of the display apparatus 1 may include a display area DA and a peripheral area PA corresponding to those described herein.

Hereinafter, an organic light-emitting display is described as an example of the display apparatus 1, but the display apparatus 1 is not limited thereto. The display apparatus 1 may include an organic light-emitting display, an inorganic light-emitting display (or an inorganic electroluminescent (EL) display), or a quantum dot light-emitting display.

The display apparatus 1 may be implemented as an electronic apparatus of various types. In an embodiment, the display apparatus 1 may include a display apparatus 1 for a vehicle, but the display apparatus 1 of the present disclosure is not limited thereto.

As shown in FIG. 2, the display apparatus 1 may include a display panel 10 and a cover window 20 which faces the display panel 10. The display panel 10 may include a substrate 100, a pixel layer 200, an encapsulation layer 300, and a light-shielding layer 400 (e.g., light-shielding pattern layer), which are sequentially stacked (in order) in (or along) a third direction (e.g., a z direction).

The substrate 100 may include a glass material or a polymer resin. For example, the substrate 100 may include a glass material with a silicon oxide ($SiO_x$) as a main element thereof, or may include a polymer resin, such as polyethersulfone, polyarylate, polyetherimide, polyethylene naphthalate, polyethylene terephthalate, polyphenylene sulfide, polyimide, polycarbonate, cellulose triacetate, and cellulose acetate propionate.

The pixel layer 200 may be disposed over the substrate 100. The pixel layer 200 may include a pixel circuit layer 210 and a display element layer 220, the pixel circuit layer 210 including a pixel circuit PC and insulating layers, and the display element layer 220 including display elements. The display element layer 220 may be disposed over the pixel circuit layer 210, and the insulating layers may be disposed between the pixel circuit PC and the display element. Some wirings and insulating layers of the pixel circuit layer 210 may extend from the display area DA and into the peripheral area PA.

The encapsulation layer 300 may be disposed over the pixel layer 200. In an embodiment, the encapsulation layer 300 may include at least one inorganic encapsulation layer and at least one organic encapsulation layer. The at least one inorganic encapsulation layer may include one or more inorganic materials from among aluminum oxide ($Al_2O_3$), titanium oxide ($TiO_2$), tantalum oxide ($Ta_2O_5$), zinc oxide (ZnO), silicon oxide ($SiO_2$), silicon nitride ($SiN_x$), and silicon oxynitride (SiON). The at least one organic encapsulation layer may include a polymer-based material. The polymer-based material may include an acryl-based resin, an epoxy-based resin, polyimide, and polyethylene. In an embodiment, the at least one organic encapsulation layer may include acrylate.

The light-shielding layer 400 may be disposed over the encapsulation layer 300. The light-shielding layer 400 may at least partially absorb external light or internal reflected light. The light-shielding layer 400 may include a black pigment. The light-shielding layer 400 may include a black matrix. The light-shielding layer 400 may be arranged in the display area DA. The light-shielding layer 400 may include a transmissive area through which light emitted by a display element arranged in the display area DA passes to outside the light-shielding layer 400.

Although not shown in FIG. 2, a touch sensor layer may be further included between the encapsulation layer 300 and the light-shielding layer 400. The touch sensor layer may include a layer for sensing an external input such as a touch input from a user and detect the external input by using at least one of various touch methods, such as a resistive method and a capacitive method.

The cover window 20 may be disposed over the display panel 10. In an embodiment, the cover window 20 may be coupled to an element therebelow, e.g., the light-shielding layer 400, by adhesion using an optically clear adhesive (OCA). The cover window 20 may protect the display panel 10. The cover window 20 may include at least one of glass, sapphire, and plastic. For example, the cover window 20 may include ultra-thin glass (UTG) and colorless polyimide (CPI).

Figure 3:
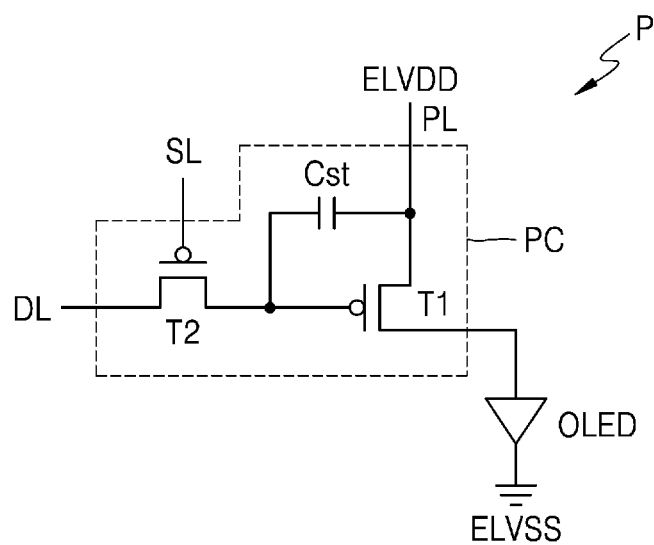
FIG. 3 is an equivalent circuit diagram of a pixel according to an embodiment.
Figure 4:
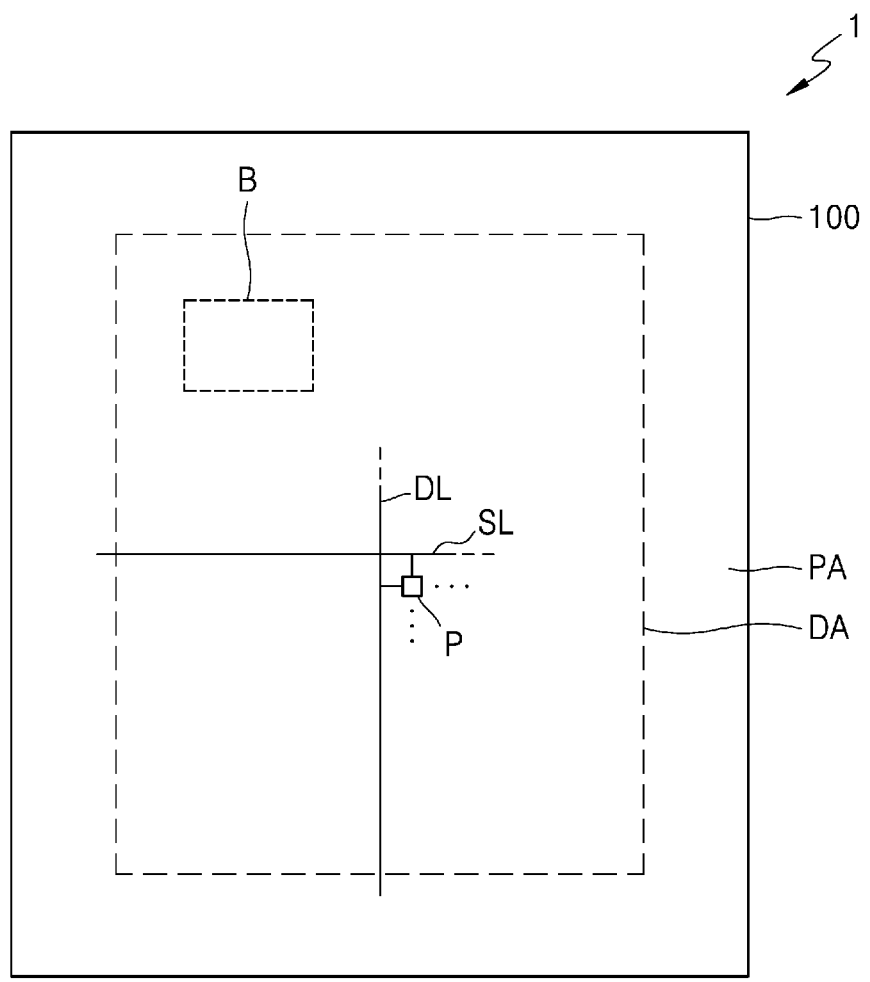
FIG. 4 is a plan view schematically illustrating a display apparatus according to an embodiment.

FIG. 3 is an equivalent circuit diagram of a pixel P according to an embodiment, and FIG. 4 is a plan view schematically illustrating a display apparatus 1 according to an embodiment.

Referring to FIGS. 3 and 4, the substrate 100 of the display apparatus 1 may be divided into the display area DA and the peripheral area PA. The display apparatus 1 may provide an image by using light emitted from a plurality of pixels P arranged in the display area DA.

Each of the pixels P may include a display element (e.g., a light-emitting element), such as an organic light-emitting diode OLED or an inorganic light-emitting diode, and emit, for example, red, green, blue, or white light. In other words, each of the pixels P may be connected to a pixel circuit PC including a thin-film transistor, a capacitor, and the like. The pixel circuit PC may be connected to a scan line SL, a data line DL crossing the scan line SL, and a driving voltage line PL. The scan line SL may extend in an x direction, and each of the data line DL and the driving voltage line PL may extend in a y direction.

Each of the pixels P may emit light by driving the pixel circuit PC, and an image may be provided in the display area DA by using light emitted from the pixels P. In the present specification, the pixel P may be defined as an emission area (e.g., a light emission area) in which any of red, green, blue, and white light is emitted, as described above.

The peripheral area PA, in which the pixels P are not arranged, may not provide an image (e.g., a non-display area). A printed circuit board including a built-in driving circuit unit for driving the pixels P, a power supply wiring, and a driving circuit unit, a terminal unit to which a driver integrated circuit (IC) is connected, or the like may be arranged in the peripheral area PA.

An organic light-emitting diode OLED that is a display element of the pixel P may be connected to a pixel circuit PC. The pixel circuit PC may include a first thin-film transistor T1, a second thin-film transistor T2, and a storage capacitor Cst. For example, the organic light-emitting diode OLED may emit one of red, green, and blue light, or may emit one of red, green, blue, and white light.

The second thin-film transistor T2, which is also referred to as a switching thin-film transistor, may be connected to the scan line SL and the data line DL and transmit a data voltage received via the data line DL to the first thin-film transistor T1 according to a switching voltage received via the scan line SL. The storage capacitor Cst may be connected to the second thin-film transistor T2 and the driving voltage line PL and store a voltage corresponding to a voltage difference between a voltage received via the second thin-film transistor T2 and a first power voltage ELVDD applied to the driving voltage line PL.

The first thin-film transistor T1, which is also referred to as a driving thin-film transistor, may be connected to the driving voltage line PL and the storage capacitor Cst and control a driving current (e.g., electrical current) flowing from the driving voltage line PL to the organic light-emitting diode OLED in response to a voltage stored in the storage capacitor Cst. The organic light-emitting diode OLED may emit light having a brightness according to the driving current. An opposite electrode (e.g., a cathode) of the organic light-emitting diode OLED may receive a second power voltage ELVSS.

Figure 5:
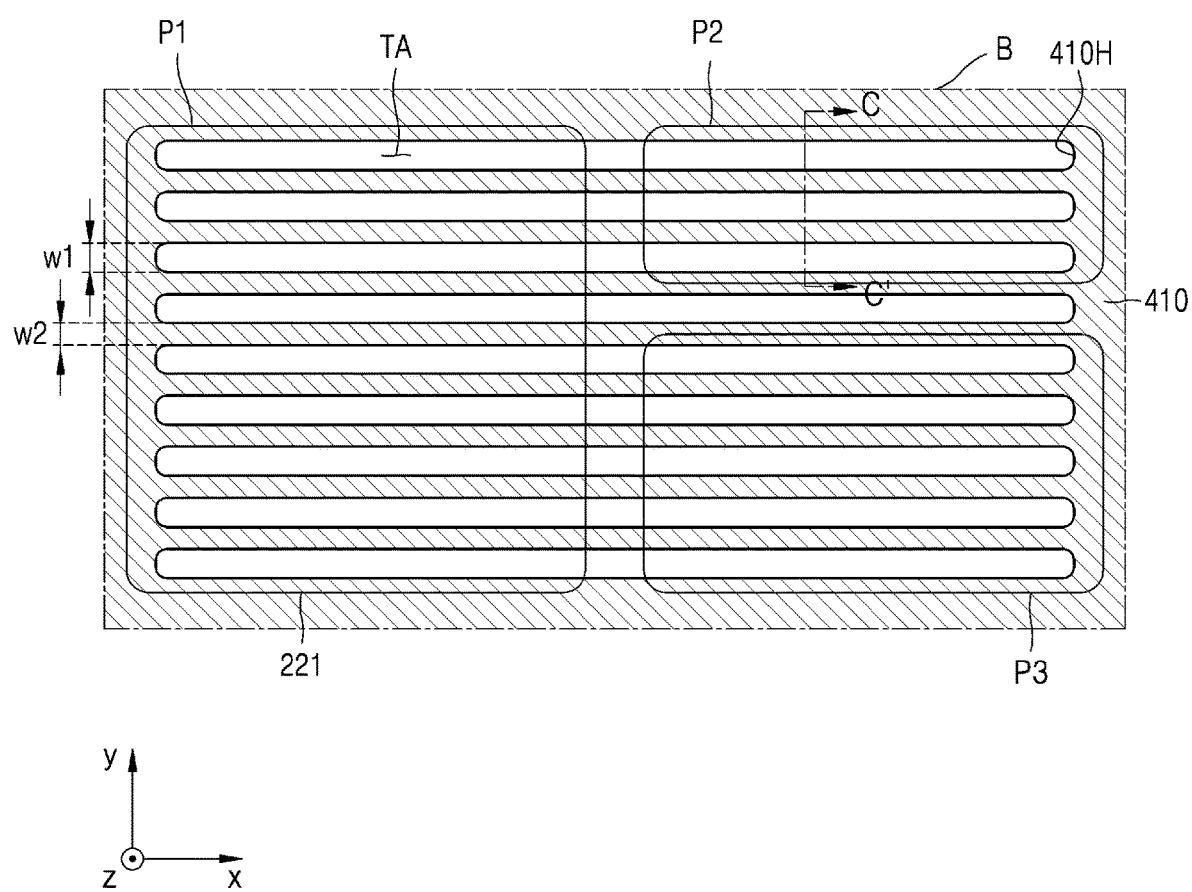
FIG. 5 is an enlarged view of a portion of a display apparatus according to an embodiment.

FIG. 5 is an enlarged view of a portion of a display apparatus 1 according to an embodiment. FIG. 5 is an enlarged view of region B in FIG. 4 and shows only a plurality of pixels P and a light-shielding pattern 410 for convenience of description.

Referring to FIG. 5, the display apparatus 1 may include a plurality of pixels P, and the plurality of pixels P may include a first pixel P1, a second pixel P2, and a third pixel P3, which emit light of different colors from each other. For example, the first pixel P1, the second pixel P2, and the third pixel P3 may emit blue, green, and red light, respectively. However, the present disclosure is not limited thereto. For example, the first pixel P1 may emit red light, the second pixel P2 may emit green light, and the third pixel P3 may emit blue light, and various modifications may be made.

Each of the first pixel P1, the second pixel P2, and the third pixel P3 may have a shape (e.g., a planar shape) of a quadrangle from among polygons. In the present specification, a polygon or a quadrangle may include round edges, such as round corners. In other words, each of the first pixel P1, the second pixel P2, and the third pixel P3 may have a quadrangular shape with round edges. In an embodiment, each of the first pixel P1, the second pixel P2, and the third pixel P3 may have a circular shape or an elliptical shape as a planar shape in a plan view.

The planar shape may have a size defined along a plane, such as along the plane defined by the x direction and the y direction shown in FIG. 5. The first pixel P1, the second pixel P2, and the third pixel P3 may differ in size from each other. For example, the second pixel P2 may be less in size than the first pixel P1 and the third pixel P3, and the first pixel P1 may be greater in size than the third pixel P3. However, the present disclosure is not limited thereto. Sizes of the first pixel P1, the second pixel P2, and the third pixel P3 may be substantially the same as each other, and various modifications may be made.

Figure 6:
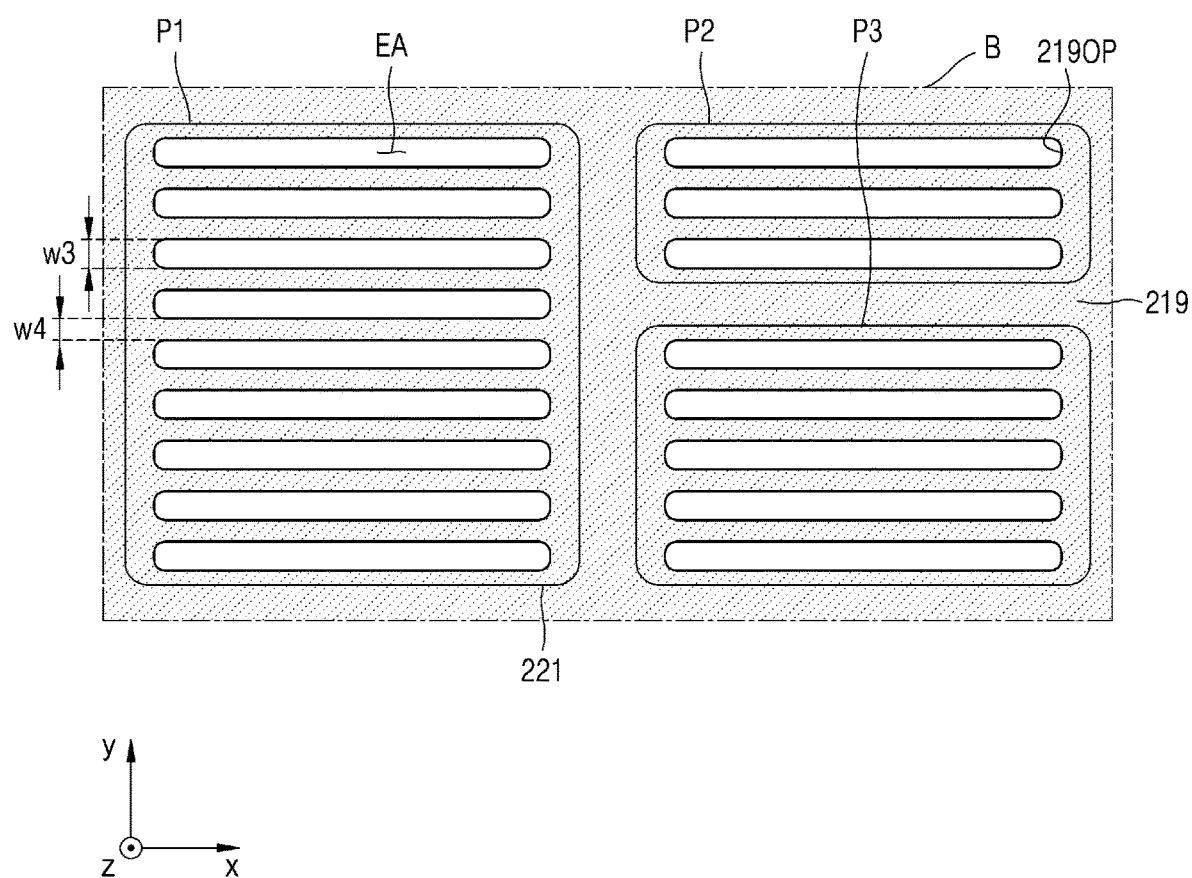
FIGS. 6 and 7 are enlarged views of a portion of a display apparatus according to embodiments.

In the present specification, the first pixel P1, the second pixel P2, and the third pixel P3 may be defined by a pixel electrode 221 of a display element that implements a color, and one pixel P may include a plurality of sub-pixels respectively defined by more than one of an opening 219OP of a pixel-defining layer 219 (see FIG. 6).

The light-shielding layer 400 (see FIG. 2) disposed over the display element layer 220 (see FIG. 2) may include the light-shielding pattern 410 having (or defining) a plurality of holes 410H therein. The holes 410H may include areas provided by removing a solid portion of the light-shielding pattern 410, and through (or at) the holes 410H, light emitted by the display element may be emitted to outside the light-shielding layer 400 (or outside the display apparatus 1). In other words, the hole 410H of the light-shielding pattern 410 may correspond to a light-transmitting area TA through which light is emitted to an upper surface FS1 (see FIG. 1) of the display apparatus 1. A body of the light-shielding pattern 410 includes a light-absorbing material, and thus, a viewing angle of the display apparatus 1 may be limited.

In a plan view, each of the plurality of holes 410H of the light-shielding pattern 410 may have a polygonal shape of which an edge (e.g., a major edge) extending in the second direction (e.g., the x direction) is round. Regarding this, FIG. 5 shows that each of the holes 410H of the light-shielding pattern 410 has a quadrangular shape with round edges at opposing ends of the major edge. A dimension (e.g., a first width w1) of the hole 410H in the first direction (e.g., the y direction) may be less than a dimension (e.g., length) of the hole 410H in the second direction (e.g., the x direction). In an embodiment, one hole 410H may overlap a plurality of pixels P that are arranged spaced apart from each other in the second direction (e.g., the x direction). Regarding this, FIG. 5 shows that a first group of same holes among the plurality of holes 410H overlap both the first pixel P1 and the second pixel P2, and a second group of same holes among the plurality of holes 410H overlap the first pixel P1 and the third pixel P3. However, the present disclosure is not limited thereto, and the number of pixels P overlapped by a same one of the hole 410H may vary. In an embodiment, taking FIGS. 5 and 6 together, a same one hole (e.g., top hole in FIG. 5) among the plurality of holes 410H of the light-shielding layer 400, overlaps both the first opening (e.g., opening 219OP of first pixel P1 in FIG. 6) and the second opening (e.g., opening 219OP of second pixel P2 in FIG. 6) of the pixel-defining layer 219.

The plurality of holes 410H may be arranged apart from each other at certain intervals in the first direction (e.g., the y direction). In other words, a solid portion of the light-shielding pattern 410 which is disposed between holes 410H adjacent to each other, may have a second width w2 in the first direction (e.g., the y direction).

Each of the first pixel P1, the second pixel P2, and the third pixel P3 may be alternately arranged with each other in the first direction (e.g., the y direction) and the second pixel P2 (e.g., the x direction) crossing the first direction (e.g., the y direction). For example, as shown in FIG. 5, the first pixels P1 may be arranged apart from each other in the first direction (e.g., the y direction) and the second direction (e.g., the x direction), and the second pixel P2 and the third pixel P3 as a pixel group may be disposed between first pixels P1 adjacent to each other. However, the present disclosure is not limited thereto, and the first pixel P1, the second pixel P2, and the third pixel P3 may be arranged in various pixel array structures, such as a PenTile™ structure, a stripe structure, a mosaic structure, or a delta structure.

Figure 7:
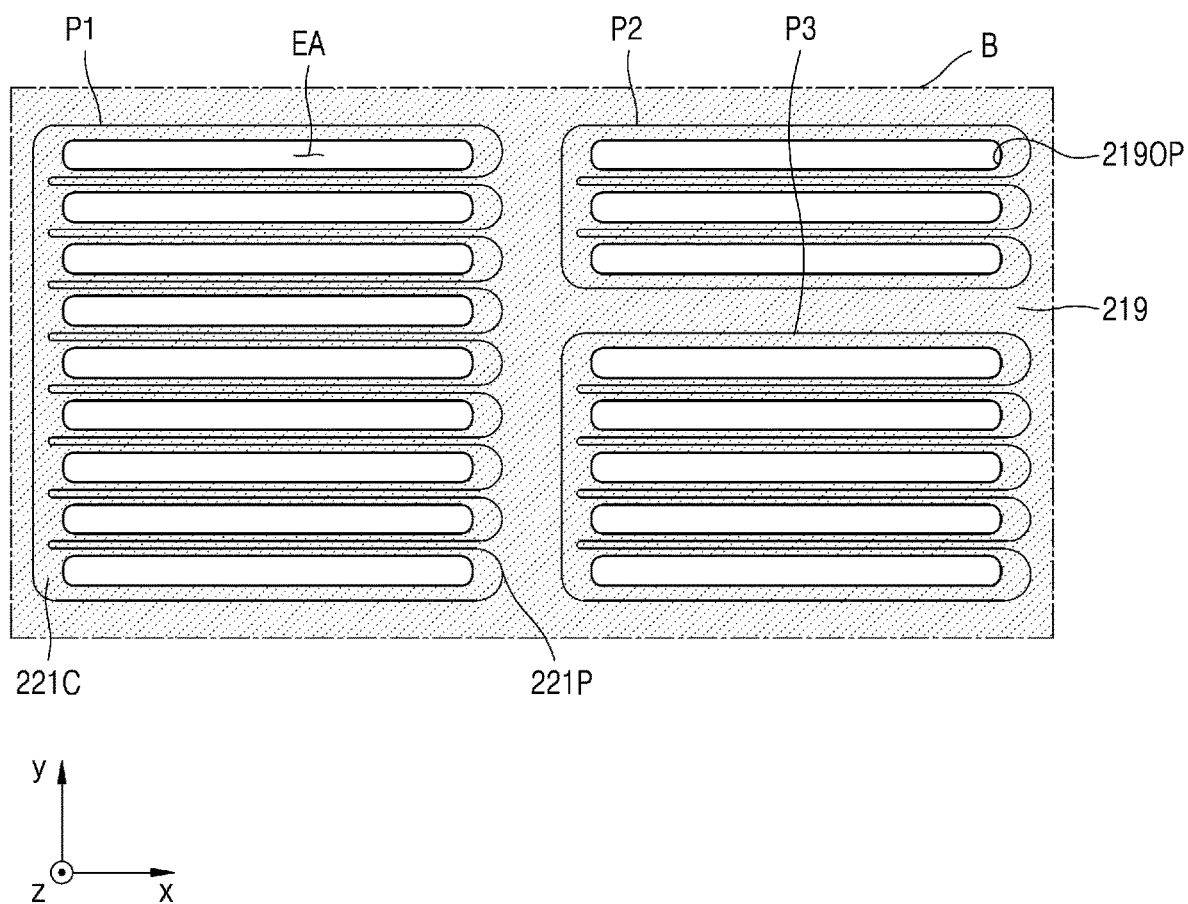

FIGS. 6 and 7 are enlarged views of a portion of a display apparatus 1 according to embodiments. FIGS. 6 and 7 are enlarged views of region B in FIG. 4 and show only a plurality of pixels P and the pixel-defining layer 219 for convenience of description.

Referring to FIGS. 6 and 7, the display apparatus 1 may include the pixel-defining layer 219 over (or corresponding to) a plurality of pixels P. The pixel-defining layer 219 may include the plurality of openings 219OP exposing a partial area of an upper surface of the pixel electrode 221 to outside the pixel-defining layer 219. The plurality of openings 219OP in the pixel-defining layer 219 are located within an edge of the pixel electrode 221 in a plan view, that is, are spaced apart from an outer edge of the pixel electrode 221.

The opening 219OP may include an area provided by removing a solid portion of the pixel-defining layer 219 and correspond to an emission area EA in which light is emitted by a display element.

The plurality of openings 219OP may have a polygonal shape of which an edge extending in the second direction (e.g., the x direction) is round. Regarding this, FIGS. 6 and 7 show that each of the openings 219OP has a quadrangular shape with round edges. A third width w3 of the openings 219OP in the first direction (e.g., they direction) may be less than a length of the openings 219OP in the second direction (e.g., the x direction). In an embodiment, a length of the openings 219OP in the second direction (e.g., the x direction) may be greater than about three times the third width w3 of the openings 219OP in the first direction (e.g., the y direction). Therefore, a component in the first direction (e.g., the y direction), of emitted light may be decreased by the light-shielding layer 400 (see FIG. 5), but a component thereof in the second direction (e.g., the x direction) may not be decreased thereby.

The pixel electrode 221 may have or define an outer edge thereof. In a plan view, the openings 219OP may be arranged within edges (e.g., within the outer edge) of the pixel electrode 221. Therefore, the pixel-defining layer 219 may cover the edges of the pixel electrode 221 and prevent an arc (e.g., an electrical arc) or the like from occurring at the edges of the pixel electrode 221.

The plurality of openings 219OP may be apart from each other to correspond to a same one pixel electrode 221, at certain intervals in the first direction (e.g., they direction). In other words, a portion (e.g., a solid portion) of the pixel-defining layer 219 disposed between and defining the openings 219OP adjacent to each other may have a fourth width w4 in the first direction (e.g., the y direction). Therefore, one pixel P may have a plurality of emission areas EA, which are divided by the openings 219OP of the pixel-defining layer 219.

The plurality of openings 219OP may be arranged to overlap (or correspond to) the holes 410H of the light-shielding pattern 410 shown in FIG. 5. The various openings of the light-transmitting area TA and the various holes of the emission area EA may be aligned with each other. A same one hole 410H may overlap one or more openings 219OP that are arranged apart from each other in the second direction (e.g., the x direction). In an embodiment, the third width w3 of the opening 219OP in the first direction (e.g., they direction) may be substantially equal to the first width w1 of the hole 410H in the first direction (e.g., the y direction). In a similar manner, the fourth width w4 of (the solid portion of) the pixel-defining layer 219 disposed between openings 219OP adjacent to each other may be substantially equal to the second width w2 of (the solid portion of) the light-shielding pattern 410 disposed between holes 410H adjacent to each other.

The pixel-defining layer 219 may include an organic insulating material, such as polyimide, polyamide, an acrylic resin, benzocyclobutene, hexamethyldisiloxane (HMDSO), and a phenolic resin, and be formed by spin coating or the like. In some embodiments, the pixel-defining layer 219 may include an inorganic insulating material. In some embodiments, the pixel-defining layer 219 may have a multi-layer structure including an inorganic insulating material and an organic insulating material.

In some embodiments, the pixel-defining layer 219 may include a light-blocking material and be provided in black. The light-blocking material may include carbon black, carbon nanotubes, a resin or paste containing a black dye, metal particles, such as nickel, aluminum, molybdenum, and alloys thereof, metal oxide particles (e.g., chromium oxide), or metal nitride particles (e.g., chromium nitride).

Referring to FIGS. 5 and 6 (together with FIG. 8 described below), the pixel electrode 221 may include a solid body having a planar shape. In some embodiments, as shown in FIG. 7, the body of the pixel electrode 221 may have a connection portion 221C extending in the first direction (e.g., they direction) and a protrusion 221P extending in the second direction (e.g., the x direction). The protrusion 221P may be provided in plurality including a plurality of protrusions 221P spaced apart from each other, and each of the protrusions 221P may be connected to the connection portion 221C and integrally provided as a single body with the connection portion 221C (like in a comb-shape). The protrusions 221P spaced apart from each other in the first direction (e.g., the y direction) may be arranged to respectively overlap the openings 219OP of the pixel-defining layer 219 and the holes 410H of the light-shielding pattern 410. In other words, solid portions of the pixel electrode 221 may be formed only at an area in which the emission area EA and the light-transmitting area TA overlap (or are aligned with) each other, and thus, power consumption may be reduced.

Figure 8:
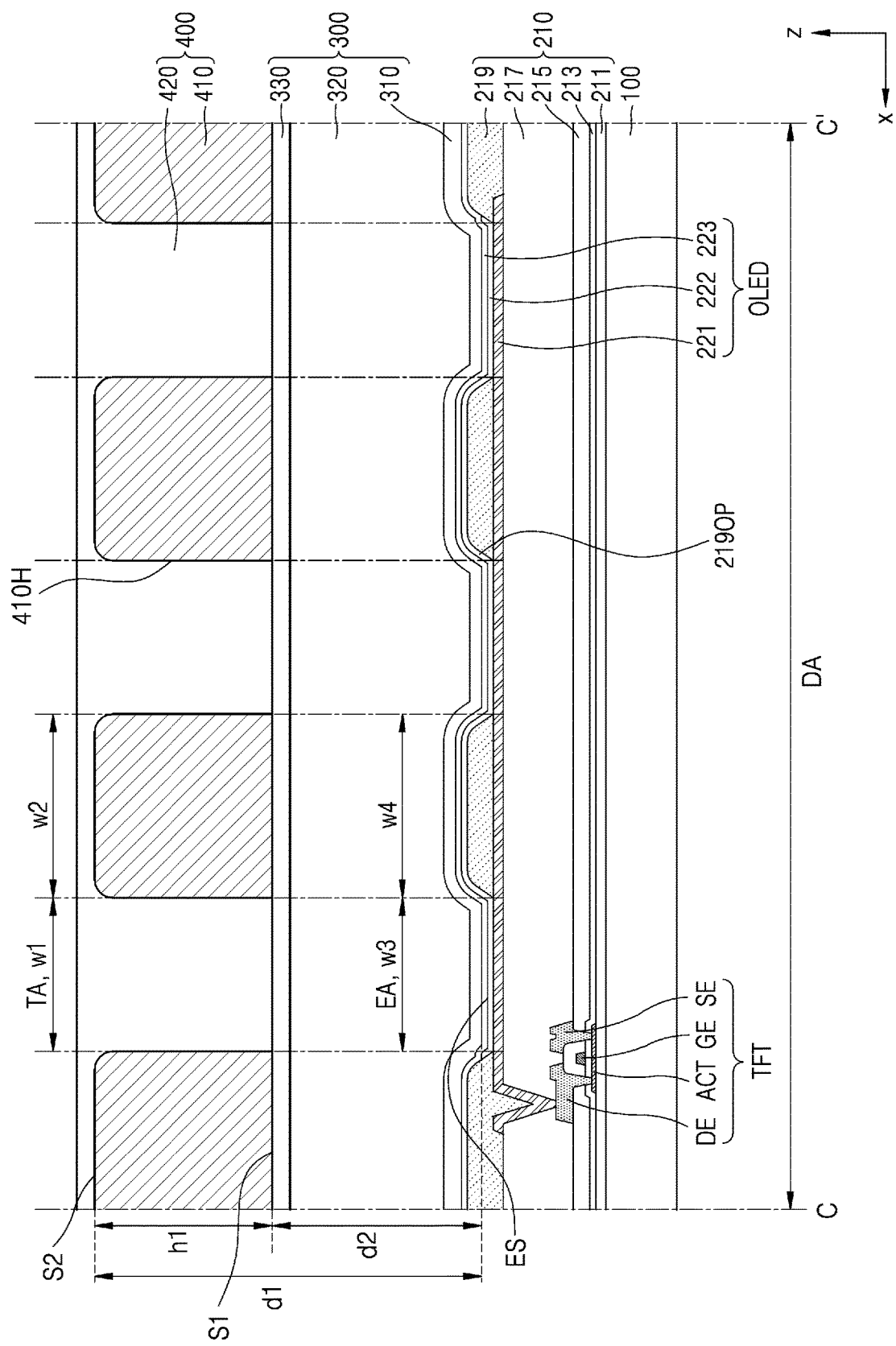
FIGS. 8 and 9 are cross-sectional views of a display apparatus according to embodiments.
Figure 9:
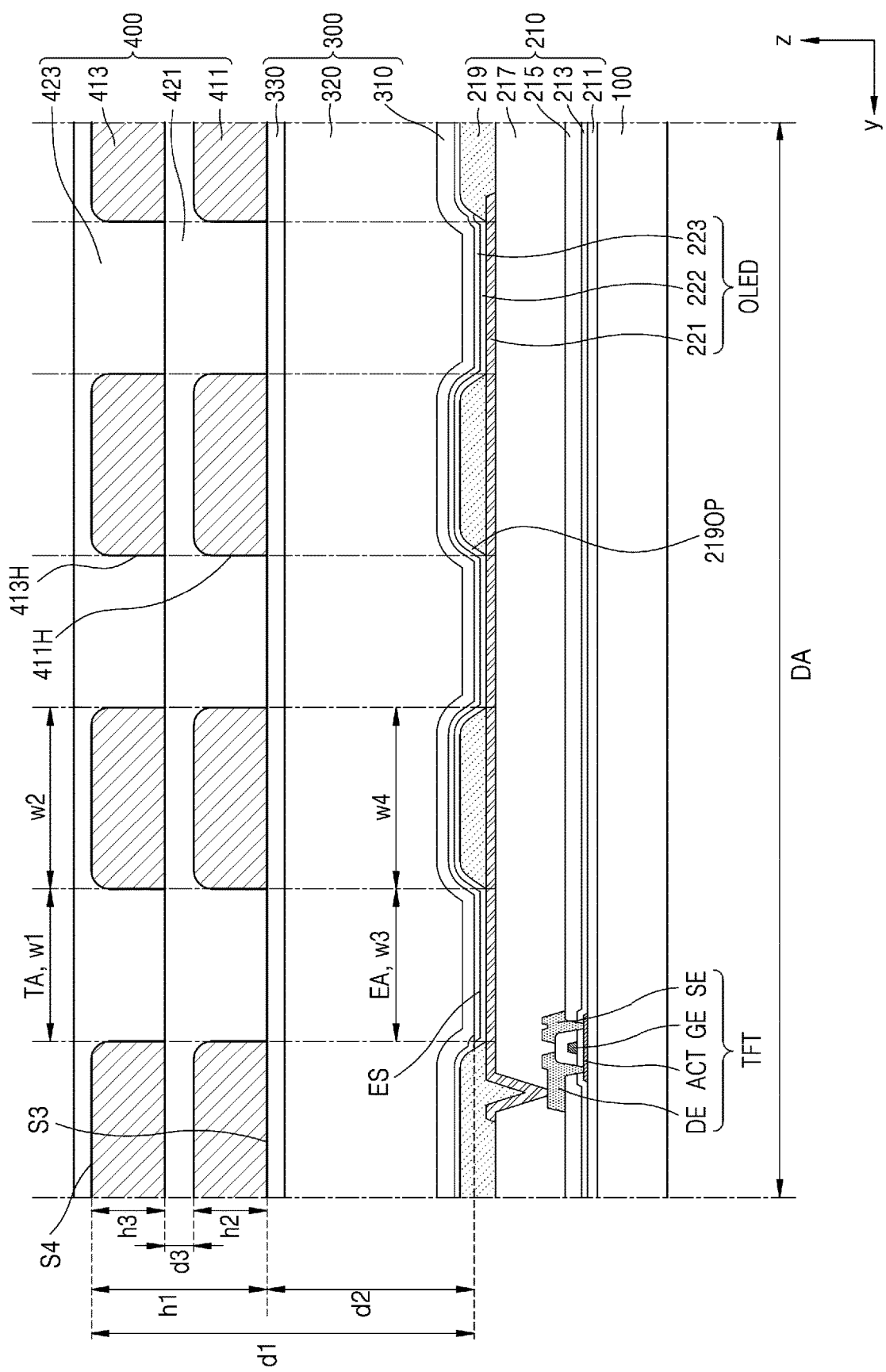

FIGS. 8 and 9 are cross-sectional views of a display apparatus 1 according to embodiments. FIGS. 8 and 9 are cross-sectional views of the display apparatus in FIG. 5, taken along line C-C' in FIG. 5.

Referring to FIGS. 8 and 9, the display apparatus 1 according to an embodiment may include the substrate 100, the pixel circuit layer 210, the organic light-emitting diode OLED that is a display element, the encapsulation layer 300, and the light-shielding layer 400.

As described above, the substrate 100 may include a glass material or a polymer resin. The pixel circuit layer 210 may be disposed over the substrate 100.

The pixel circuit layer 210 may include a thin-film transistor TFT and a storage capacitor (not shown). The thin-film transistor TFT may include a semiconductor layer ACT, which includes amorphous silicon, polycrystalline silicon, or an organic semiconductor material, a gate electrode GE, a source electrode SE, and a drain electrode DE. In order to ensure insulation between the semiconductor layer ACT and the gate electrode GE, a gate insulating layer 213, which includes a silicon oxide ($SiO_x$), $SiN_x$, and/or SiON, may be disposed between the semiconductor layer ACT and the gate electrode GE.

An interlayer insulating layer 215 including an inorganic material such as $SiO_x$, $SiN_x$, and/or SiON may be disposed over the gate electrode GE, and the source electrode SE and the drain electrode DE may be disposed over the interlayer insulating layer 215. An insulating layer including an inorganic material may be provided by chemical vapor deposition (CVD) or atomic layer deposition (ALD).

Each of the gate electrode GE, the source electrode SE, and the drain electrode DE may include various conductive materials. The gate electrode GE may include at least one of molybdenum (Mo), aluminum (Al), copper (Cu,), and titanium (Ti), and have a multi-layer structure if necessary. For example, the gate electrode GE may have a single Mo layer, or may have a three-layer structure including a Mo layer, an Al layer, and another Mo layer. Each of the source electrode SE and the drain electrode DE may include at least one of Cu, Ti, and Al, and may have a multi-layer structure if necessary. For example, each of the source electrode SE and the drain electrode DE may have a three-layer structure including a Ti layer, an Al layer, and another Ti layer.

A buffer layer 211, which includes an inorganic material such as $SiO_x$, $SiN_x$, and SiON, may be disposed between the thin-film transistor TFT and the substrate 100. The buffer layer 211 may increase a smoothness of an upper surface of the substrate 100 or prevent or minimize the permeation of impurities from the substrate 100 or the like into the semiconductor layer ACT of the thin-film transistor TFT.

A planarization insulating layer 217 may be disposed over the thin-film transistor TFT. The planarization insulating layer 217 may include an organic material, such as acryl, benzocyclobutene (BCB), and HMDSO. In FIGS. 8 and 9, the planarization insulating layer 217 includes a single layer. However, the planarization insulating layer 217 may include layers.

The pixel electrode 221 may be disposed over the planarization insulating layer 217. The pixel electrode 221 may be provided in plural including pixel electrodes 221 respectively arranged for each pixel. The pixel electrodes 221 respectively corresponding to adjacent pixels P may be arranged apart (e.g., spaced apart) from each other.

The pixel electrode 221 may include a reflective electrode. In some embodiments, the pixel electrode 221 may have a reflective layer and a transparent or semi-transparent electrode layer provided on the reflective layer, where the reflective layer includes silver (Ag), magnesium (Mg), Al, platinum (Pt), palladium (Pd), gold (Au), nickel (Ni), neodymium (Nd), iridium (Ir), chromium (Cr), and a compound thereof. The transparent or semi-transparent electrode layer may have at least one selected from the group consisting of indium tin oxide (ITO), indium zinc oxide (IZO), ZnO, indium oxide ($In_2O_3$), indium gallium oxide (IGO), and aluminum zinc oxide (AZO). In some embodiments, the pixel electrode 221 may have a three-layer structure of an ITO layer, an Ag layer, and another ITO layer.

The pixel-defining layer 219 may be disposed over the pixel electrode 221. The pixel-defining layer 219 may have (or define) a plurality of openings 219OP exposing the upper surface of the pixel electrode 221 which is furthest from the substrate 100, to outside the pixel-defining layer 219. The pixel-defining layer 219 may cover an edge of the pixel electrode 221 and increase a distance between the edge of the pixel electrode 221 and an opposite electrode 223, to thereby prevent an arc or the like from occurring at the edge of the pixel electrode 221. The pixel-defining layer 219 may include an organic insulating material, such as polyimide, polyamide, acrylic resin, BCB, HMDSO, and a phenolic resin, and may be provided by spin coating or the like. In some embodiments, the pixel-defining layer 219 may include an inorganic insulating material. In some embodiments, the pixel-defining layer 219 may have a multi-layer structure including an inorganic insulating material and an organic insulating material.

In some embodiments, the pixel-defining layer 219 may include a light-blocking material and be provided in a black color. The light-blocking material may include carbon black, carbon nanotubes, a resin or paste containing a black dye, metal particles, such as Ni, Al, Mo, and alloys thereof, metal oxide particles (e.g., chromium oxide), or metal nitride particles (e.g., chromium nitride).

The openings 219OP of the pixel-defining layer 219 may have the third width w3 in the second direction (e.g., the x direction), and a portion of the pixel-defining layer 219 disposed between the openings 219OP may have the fourth width w4. A same one pixel electrode 221 may overlap the plurality of openings 219OP.

An emission layer 222 may be disposed over the pixel electrode 221. The emission layer 222 may include an organic material including a fluorescent or phosphorous material that emits red, green, or blue light. The organic material described above may include a low-molecular weight organic material or a polymer organic material. The emission layer 222 may be arranged to correspond to the pixel electrode 221. Accordingly, the emission layer 222 may be arranged to overlap the plurality of openings 219OP.

A first common layer (not shown) and/or a second common layer (not shown) may be disposed under and over the emission layer 222. The first common layer may include an element disposed under the emission layer 222, and may include, for example, a hole transport layer (HTL) or may include an HTL and a hole injection layer (HIL). The second common layer may include an element disposed over the emission layer 222, and may include an electron transport layer (ETL) and/or an electron injection layer (EIL). In some embodiments, the second common layer may be omitted.

While the emission layer 222 is arranged for each pixel P to correspond to the pixel electrode 221, the first common layer and the second common layer may be common layers that are integrally formed as a single body so as to fully cover the substrate 100, e.g., a display area DA of the substrate 100, like the opposite electrode 223 to be described below.

The opposite electrode 223 may include a cathode that is an electron injection electrode, and in this case, a metal having a low work function, an alloy, an electrically conductive compound, or any combinations thereof may be used as a material of the opposite electrode 223. The opposite electrode 223 may include a transmissive electrode, a semi-transmissive electrode, or a reflective electrode.

The opposite electrode 223 may include lithium (Li), Ag, Mg, Al, Al—Li, calcium (Ca), Mg—In, Mg—Ag, ytterbium (Yb), Ag—Yb, ITO, IZO, or any combinations thereof. The opposite electrode 223 may include a layer or layers.

A capping layer (not shown) may be further disposed over the opposite electrode 223. The capping layer may improve an external emission efficiency of an organic light-emitting element by the principle of constructive interference. The capping layer may include a material having a refractive index (at 589 nanometers (nm)) of about 1.6 or greater. A thickness of the capping layer may be about 1 nanometer (nm) to about 200 nm, for example, about 5 nm to about 150 nm or about 10 nm to about 100 nm. The capping layer may include an organic capping layer including an organic material, an inorganic capping layer including an inorganic material, or a composite capping layer including an organic material and an inorganic material.

The encapsulation layer 300, which seals a display element, may be disposed over the organic light-emitting diode OLED. The encapsulation layer 300 may include at least one inorganic encapsulation layer and at least one organic encapsulation layer. The at least one inorganic encapsulation layer may include one or more inorganic materials from among $Al_2O_3$, $TiO_2$, $Ta_2O_5$, ZnO, $SiO_2$, $SiN_x$, and SiON. The at least one organic encapsulation layer may include a polymer-based material. The polymer-based material may include an acryl-based resin, an epoxy-based resin, polyimide, and polyethylene. In an embodiment, the at least one organic encapsulation layer may include acrylate. In FIGS. 8 and 9, the encapsulation layer 300 includes a first inorganic encapsulation layer 310, a second inorganic encapsulation layer 330, and an organic encapsulation layer 320 disposed between the first inorganic encapsulation layer 310 and the second inorganic encapsulation layer 330.

The light-shielding layer 400 may be disposed over the encapsulation layer 300. The light-shielding layer 400 may include the light-shielding pattern 410 (e.g., a light-shielding portion) and a light-transmitting layer 420 (e.g., a light-transmitting portion) which covers the light-shielding pattern 410. The light-shielding pattern 410 may have the plurality of holes 410H. The holes 410H may be arranged to overlap the openings 219OP of the pixel-defining layer 219. In an embodiment, a first width w1 of one hole 410H in the first direction (e.g., they direction) may be substantially equal to the third width w3 of the opening 219OP in the first direction (e.g., they direction). In other words, a width of the emission area EA and a width of the light-transmitting area TA may be substantially equal to the first width w1 of the hole 410H.

The holes 410H adjacent to each other may be arranged apart from each other at certain intervals. A second width w2 in the first direction (e.g., the y direction) of the light-shielding pattern 410 disposed between the holes 410H adjacent to each other may be substantially equal to a fourth width w4 in the first direction (e.g., the y direction) of the pixel-defining layer 219 disposed between the openings 219OP adjacent to each other.

The light-transmitting layer 420 may be arranged to cover the light-shielding pattern 410. The light-transmitting layer 420 may bury the holes 410H, such as by filling the holes 410H and/or extending out of the holes 410H and along an upper surface of the light-shielding pattern 410. The light-transmitting layer 420 may include an organic material having a low refractive index. In an embodiment, the light-transmitting layer 420 may include an acryl-based resin (e.g., poly(methyl methacrylate), polyacrylic acid, etc.) ethylhexyl acrylate, pentafluoropropyl acrylate, poly(ethylene glycol) dimethacrylate, or ethylene glycol dimethacrylate. A refractive index of the light-transmitting layer 420 may be substantially equal to a refractive index of the organic encapsulation layer 320 of the encapsulation layer 300. In some embodiments, the refractive index of the light-transmitting layer 420 may be between about 1.4 and about 1.5.

A respective upper surface of an element may be furthest from the substrate 100, while a respective lower surface of an element may be closest to the substrate 100, along a thickness direction of display apparatus 1. A first distance d1 from an upper surface ES of the display element layer 220 (or the pixel layer 200) at the emission area EA (e.g., an upper surface ES of the emission layer 222 at the emission area EA) that is an area in which the organic light-emitting diode OLED emits light, to an upper surface S2 of the light-shielding pattern 410, may be determined by the refractive index of the organic encapsulation layer 320, the refractive index of the light-transmitting layer 420, and the third width w3 of the opening 219OP. For example, when the refractive index of the light-transmitting layer 420 is about 1.4 to about 1.5, the first distance d1 from the upper surface ES of the emission area EA to the upper surface S2 of the light-shielding pattern 410 may be about 2.6 to about 2.8 times the third width w3 of the opening 219OP. In this case, light emitted from one emission area EA through the light-transmitting area TA corresponding to the emission area EA may be limited to about 30 degrees or less with respect to a direction (e.g. the z direction) which is perpendicular (or normal) to the upper surface of the substrate 100.

The second width w2 of the light-shielding pattern 410 in the first direction (e.g., the y direction) may be equal to the fourth width w4 of the pixel-defining layer 219 in the first direction (e.g., the y direction), where the light-shielding pattern 410 is disposed between holes 410H adjacent to each other from among the plurality of holes 410H, and the pixel-defining layer 219 is disposed between openings 219OP adjacent to each other. In an embodiment, when the refractive index of the light-transmitting layer 420 is about 1.4 to about 1.5, the second width w2 of the light-shielding pattern 410 in the first direction (e.g., they direction) may be about 1.5 to about 1.7 times the third width w3 of the opening 219OP.

A minimum thickness of the light-shielding pattern 410 may be determined to block light emitted from one emission area EA through light-transmitting areas TA adjacent to each other in a plan view. In an embodiment, when the refractive index of the light-transmitting layer 420 is about 1.5, a first thickness h1 of the light-shielding pattern 410 may be greater than about 0.8 times the second width w2 of the light-shielding pattern 410 in the first direction (e.g., they direction).

A second distance d2 from the upper surface ES of the emission area EA to a lower surface S1 of the light-shielding pattern 410 may be equal to a difference between the first distance d1 from the upper surface ES of the emission area to the upper surface S2 of the light-shielding pattern 410, and the first thickness h1 of the light-shielding pattern 410. In other words, a thickness of the encapsulation layer 300 may be determined by the difference between the first distance d1 from the upper surface ES of the emission area EA to the upper surface S2 of the light-shielding pattern 410 and the first thickness h1 of the light-shielding pattern 410.

The light-shielding pattern 410 may include a layer or layers. Regarding this, FIG. 8 shows the light-shielding pattern 410 as a single layer, and FIG. 9 shows the light-shielding pattern 410 including a first sub-pattern 411 (e.g., a first light-shielding pattern layer) and a second sub-pattern 413 (e.g., a second light-shielding pattern layer).

The light-shielding pattern 410 may include a material that blocks most of light in a visible light area, and have a wavelength spectrum that generally absorbs a wavelength of about 380 nm to about 780 nm. In an embodiment, when the first thickness h1 of the light-shielding pattern 410 is at least about 0.8 times the second width w2 of the light-shielding pattern 410 in the first direction (e.g., the y direction), the display apparatus 1 may reduce a luminance of light having an angle of about 30 degrees or greater from the third direction (e.g., the z direction) perpendicular to the upper surface of the substrate 100 to the first direction (e.g., the y direction) without a separate optical film, and an aperture ratio in the first direction (e.g., the y direction) may be about 40% or greater. In an embodiment, when the first thickness h1 of the light-shielding pattern 410 is at least about 0.3 times the second width w2 of the light-shielding pattern 410 in the first direction (e.g., the y direction), the display apparatus 1 may sufficiently reduce a luminance of light having an angle of about 30 degrees or greater from the third direction (e.g., the z direction) perpendicular to the upper surface of the substrate 100 to the first direction (e.g., the y direction) without a separate optical film, and an aperture ratio in the first direction (e.g., the y direction) may be about 60% or greater.

In order to constantly maintain the second width w2 of the light-shielding pattern 410, which is disposed between holes 410H adjacent to each other, in the first direction (e.g., they direction) and increase the first thickness h1 of the light-shielding pattern 410, the light-shielding pattern 410 may have a multi-layer structure including a plurality of sub-patterns as shown in FIG. 9. In an embodiment, the light-shielding pattern 410 may include the first sub-pattern 411 having a plurality of first sub-holes 411H and the second sub-pattern 413 having a plurality of second sub-holes 413H. A first light-transmitting layer 421 may be disposed over the first sub-pattern 411. The first light-transmitting layer 421 may bury the first sub-holes 411H and cover an upper surface of the first sub-pattern 411. The second sub-pattern 413 may be disposed over the first light-transmitting layer 421. The plurality of second sub-holes 413H of the second sub-pattern 413 may be arranged to overlap the plurality of first sub-holes 411H of the first sub-pattern 411.

A total thickness of the light-shielding pattern 410 may be equal to a first thickness h1 from a lower surface S3 of the first sub-pattern 411 to an upper surface S4 of the second sub-pattern 413. Therefore, when the first light-transmitting layer 421 is disposed between the first sub-pattern 411 and the second sub-pattern 413, each of a second thickness h2 of the first sub-pattern 411 and a third thickness h3 of the second sub-pattern 413 may be less than or equal to about 0.8 times the second width w2 of the light-shielding pattern 410 in the first direction (e.g., they direction).

Figure 10:
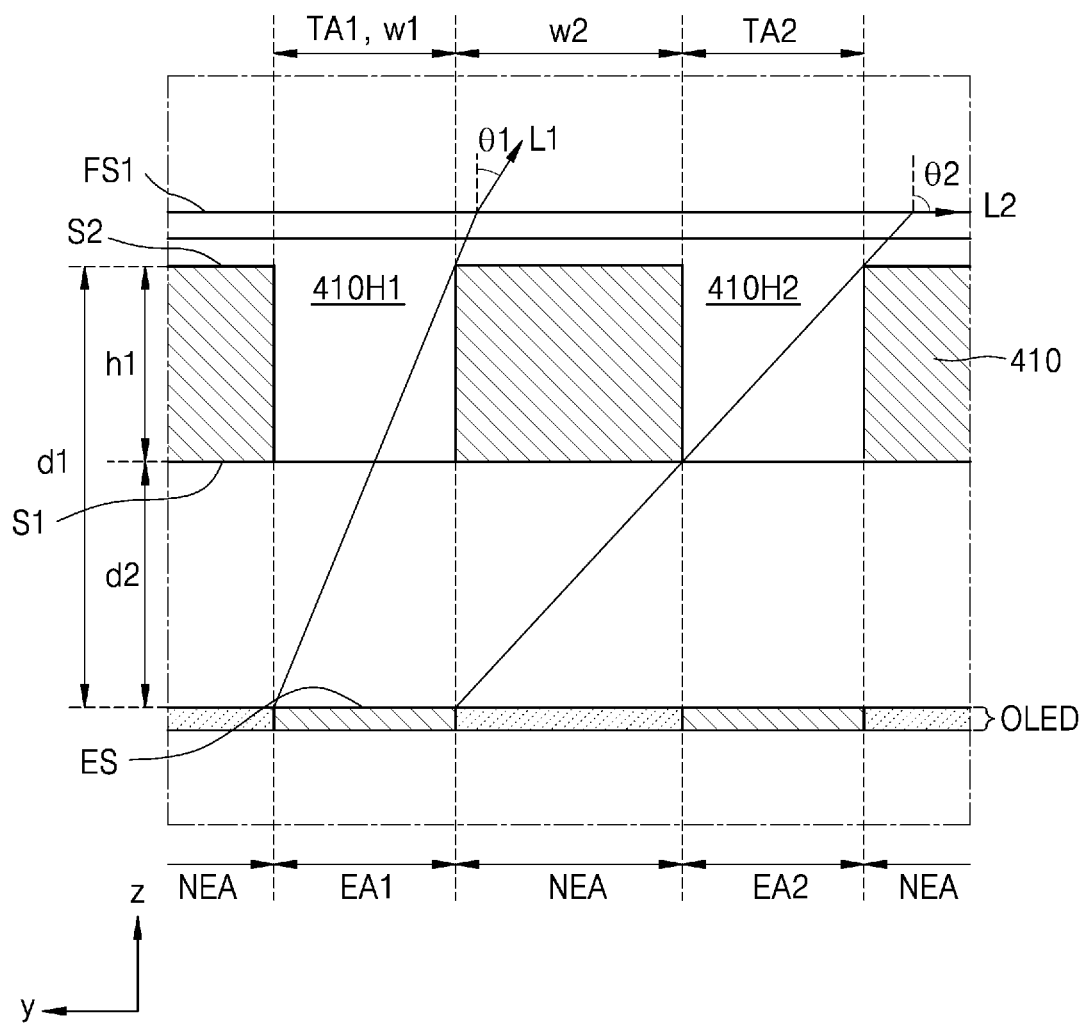
FIGS. 10 and 11 are schematic diagrams illustrating a path of light within a display apparatus according to embodiments.
Figure 11:
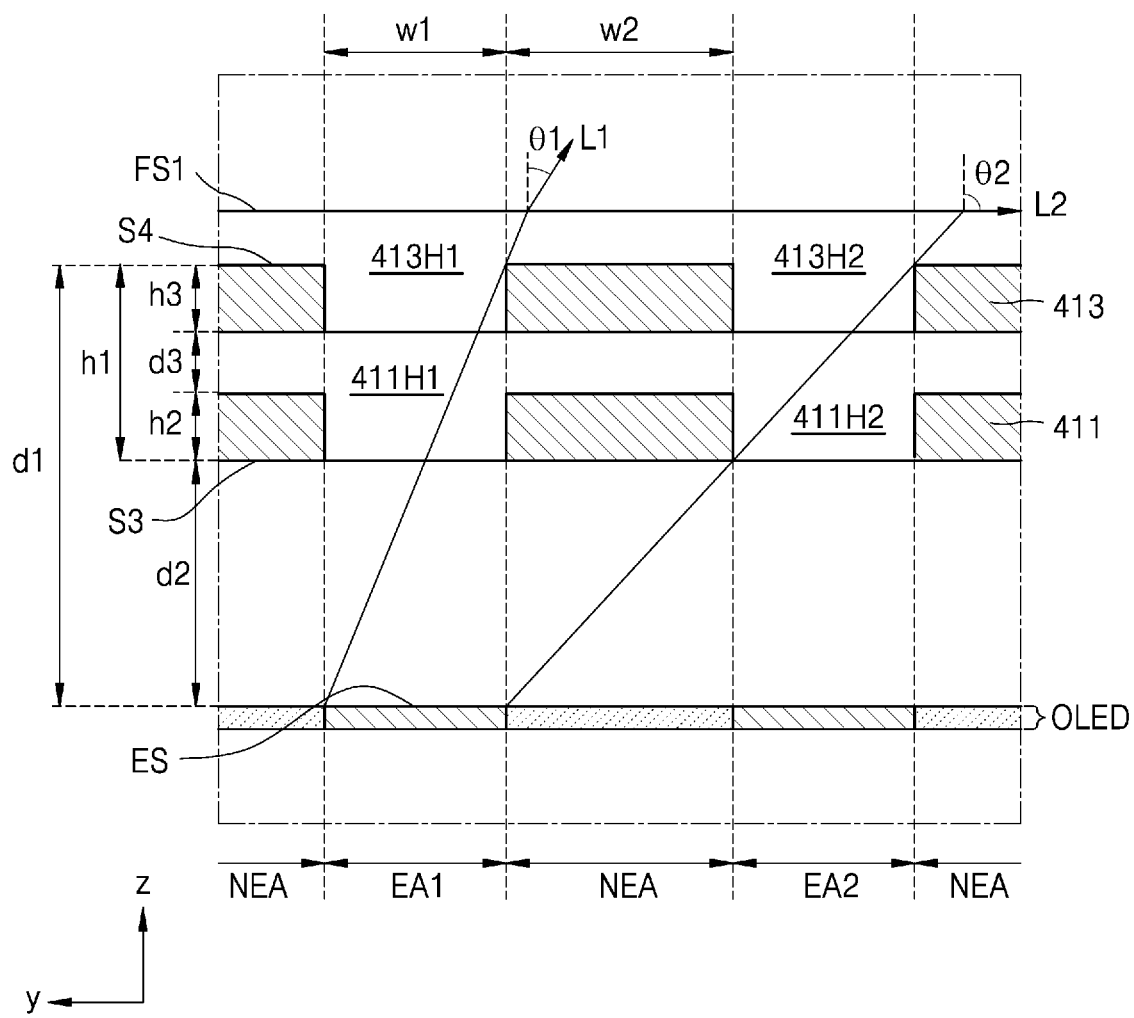

FIGS. 10 and 11 are schematic diagrams illustrating a path of light within a display apparatus 1 according to embodiments.

Referring to FIG. 10, a width, in the first direction (e.g., they direction), of the first emission area EA1 and the first light-transmitting area TA1 overlapping each other in a plan view, may be substantially equal to the first width w1 of the first hole 410H1 in the first direction (e.g., the y direction). Widths, in the first direction (e.g., the y direction), of a second emission area EA2 adjacent to the first emission area EA1, and a second light-transmitting area TA2 overlapping the second emission area EA2, may be substantially equal to the first width w1 of the second hole 410H2 in the first direction (e.g., the y direction).

The second width w2, in the first direction (e.g., the y direction), of the light-shielding pattern 410 disposed between the first hole 410H1 and a second hole 410H2 may be substantially equal to a width of a non-emission area NEA between the first emission area EA1 and a second emission area EA2 which is adjacent to the first emission area EA1. Therefore, an aperture ratio of the display apparatus 1 in the first direction (e.g., the y direction) may be determined by a ratio of the first width w1 of the first hole 410H1 in the first direction (e.g., the y direction) to the second width w2 of the light-shielding pattern 410 in the first direction (e.g., they direction).

When a path of light emitted from the first emission area EA1 to an upper surface FS1 of the display apparatus 1 via the first light-transmitting area TA1 is referred to as a first path L1, a light exit angle θ1 of the first path L1 in the first direction (e.g., the y direction) may be limited to about 30 degrees or less. In an embodiment, a refractive index from the upper surface ES of the emission area EA1 (at the upper surface ES of the emission layer 222) to the upper surface FS1 of the display apparatus 1 may be between about 1.4 and about 1.5. In this case, in order to limit the light exit angle θ1 of the first path L1 in the first direction (e.g., the y direction) to about 30 degrees or less, the first distance d1 from the upper surface ES of the emission area EA to the upper surface S2 of the light-shielding pattern 410 may be about 2.6 to about 2.8 times the first width w1 of the first hole 410H1 in the first direction (e.g., they direction). In a similar manner, a maximum value of the second width w2, in the first direction (e.g., the y direction), of the light-shielding pattern 410 disposed between the first hole 410H1 and the second hole 410H2 may be about 1.5 to about 1.7 times the first width w1 of the first hole 410H1 in the first direction (e.g., the y direction).

When a path of light emitted from the first emission area EA1 to the upper surface FS1 of the display apparatus 1 via a second light-transmitting area TA2 is referred to as a second path L2, a light exit angle θ2 of the second path L2 in the first direction (e.g., the y direction) may be limited to about 90 degrees or greater. When a refractive index from the upper surface ES of the emission area EA to the upper surface FS1 of the display apparatus 1 is between about 1.4 and about 1.5, in order to limit the light exit angle θ2 of the second path L2 in the first direction (e.g., the y direction) to about 90 degrees or greater, the first thickness h1 of the light-shielding pattern 410 may be greater than or equal to the first width w1 of the first hole 410H1 in the first direction (e.g., they direction). In an embodiment, the first thickness h1 of the light-shielding pattern 410 may be greater than about 0.8 times the second width w2 of the light-shielding pattern 410 in the first direction (e.g., the y direction).

As a ratio of the first thickness h1 of the light-shielding pattern 410 to the second width w2 of the light-shielding pattern 410 in the first direction (e.g., the y direction) increases, the aperture ratio of the display apparatus 1 in the first direction (e.g., the y direction) may be improved. However, an aspect ratio of the light-shielding pattern 410 may be limited according to a physical property of a material included in the light-shielding pattern 410. Accordingly, the light-shielding pattern 410 may have a multi-layer structure including a plurality of sub-patterns. Regarding this, FIG. 11 shows a light-shielding pattern including two layers of the first sub-pattern 411 and the second sub-pattern 413.

Referring to FIG. 11, the first sub-pattern 411 may include a plurality of first sub-holes including a $1^{st}$-$1^{st}$ sub-hole 411H1 and a $1^{st}$-$2^{nd}$ sub-hole 411H2 adjacent to each other, and the second sub-pattern 413 may include a plurality of second sub-holes including a $2^{nd}$-$1^{st}$ sub-hole 413H1 and a $2^{nd}$-$2^{nd}$ sub-hole 413H2 adjacent to each other. In a plan view, the first emission area EA1 may overlap the $1^{st}$-$1^{st}$ sub-hole 411H1 and the $2^{nd}$-$1^{st}$ sub-hole 413H1, and the second emission area EA2 may overlap the $1^{st}$-$2^{nd}$ sub-hole 411H2 and the $2^{nd}$-$2^{nd}$ sub-hole 413H2.

When a path of light emitted from the first emission area EA1 to the upper surface FS1 of the display apparatus 1 via the $1^{st}$-$1^{st}$ sub-hole 411H1 and the $2^{nd}$-$1^{st}$ sub-hole 413H1 is referred to as the first path L1, and a path of light emitted from the second emission area EA2 to the upper surface FS1 of the display apparatus 1 via the $1^{st}$-$2^{nd}$ sub-hole 411H2 and the $2^{nd}$-$2^{nd}$ sub-hole 413H2 is referred to as the second path L2, light paths between the first path L1 and the second path L2 may be effectively blocked by the first sub-pattern 411 and the second sub-pattern 413.

The first thickness h1 from the lower surface S3 of the first sub-pattern 411 to the upper surface S4 of the second sub-pattern 413 is equal to a sum of the second thickness h2 of the first sub-pattern 411, the third thickness h3 of the second sub-pattern 413, and a third distance d3 between the first sub-pattern 411 and the second sub-pattern 413. Therefore, the total first thickness h1 of the light-shielding pattern is formed to be at least about 0.8 times a width of the light-shielding pattern 410 in the first direction (e.g., the y direction) while maintaining an aspect ratio of each sub-pattern within an allowable range, and thus, the aperture ratio of the display apparatus 1 may improve.

Figure 12:
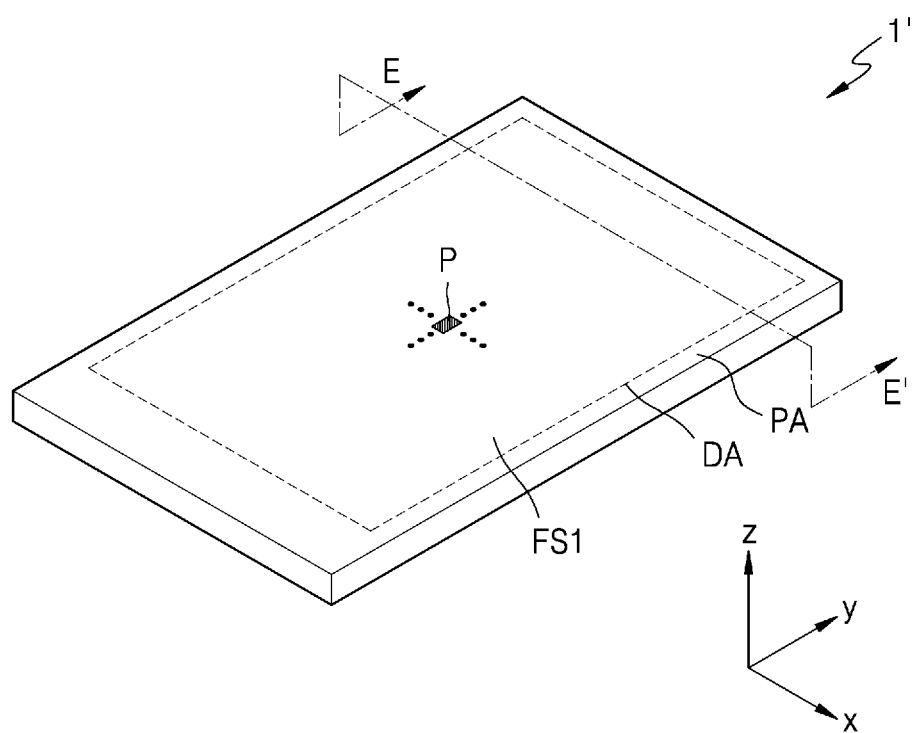
FIG. 12 is a perspective view schematically illustrating a display apparatus according to an embodiment.
Figure 13:
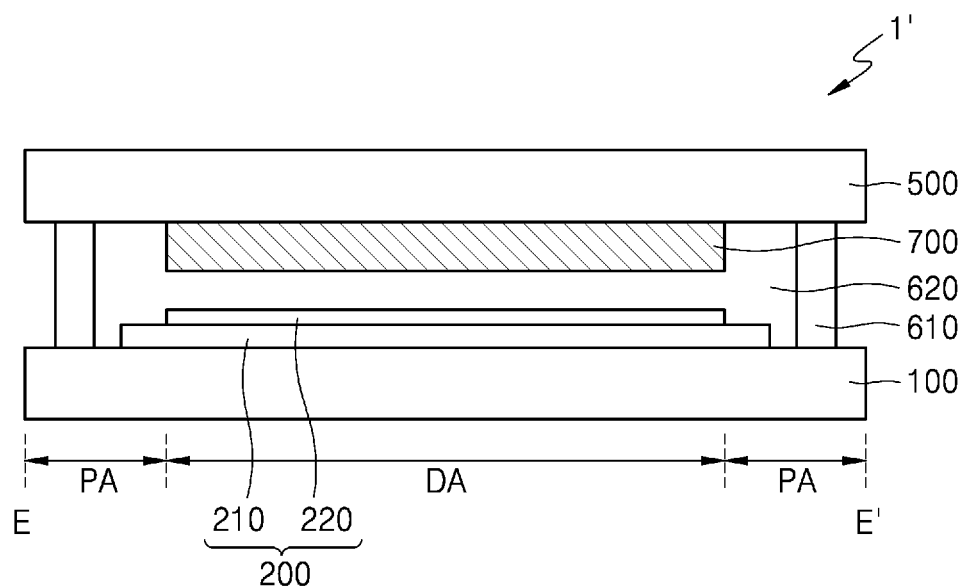
FIG. 13 is a cross-sectional view of the display apparatus in FIG. 12, taken along line E-E' in FIG. 12.

FIG. 12 is a perspective view schematically illustrating a display apparatus 1' according to an embodiment, and FIG. 13 is a cross-sectional view of the display apparatus 1' in FIG. 12, taken along line E-E' in FIG. 12.

Referring to FIG. 12, a display apparatus 1' according to an embodiment may include a display area DA and a peripheral area PA. The peripheral area PA may be arranged outside the display area DA to surround the display area DA. In the peripheral area PA, various wirings and driving circuit units configured to transmit electrical signals to the display area DA may be located. The display apparatus 1' may provide an image by using light emitted from a plurality of pixels P arranged in the display area DA.

Hereinafter, an organic light-emitting display apparatus is described as an example of the display apparatus 1', but the display apparatus 1' is not limited thereto. The display apparatus 1' may include a display apparatus 1', such as an organic light-emitting display, an inorganic light-emitting display (or an inorganic EL display), or a quantum dot light-emitting display.

The display apparatus 1' may be implemented as an electronic apparatus of various types. In an embodiment, the display apparatus 1' may include a display apparatus 1 for a vehicle, but the display apparatus 1' of the present disclosure is not limited thereto.

As shown in FIG. 13, the display apparatus 1' may include a substrate 100 on which a pixel layer 200 is stacked, and an encapsulation substrate 500 for sealing the substrate 100.

The substrate 100 may include a glass material or a polymer resin. For example, the substrate 100 may include a glass material with $SiO_x$ as a main element thereof, or may include a polymer resin, such as polyethersulfone, polyarylate, polyetherimide, polyethylene naphthalate, polyethylene terephthalate, polyphenylene sulfide, polyimide, polycarbonate, cellulose triacetate, and cellulose acetate propionate.

The pixel layer 200 may be disposed over the substrate 100. The pixel layer 200 may include a pixel circuit layer 210 and a display element layer 220, the pixel circuit layer 210 including a pixel circuit PC and insulating layers, and the display element layer 220 including display elements. The display element layer 220 may be disposed over the pixel circuit layer 210, and the insulating layers may be disposed between the pixel circuit PC and the display element. Some wirings and insulating layers of the pixel circuit layer 210 may extend to the peripheral area PA.

The encapsulation substrate 500 may be arranged to face the substrate 100, and may be bonded to the substrate 100 by means of an encapsulation member 610 (e.g., sealing member). The encapsulation substrate 500 and the encapsulation member 610 may block the pixel layer 200 including display elements, from external moisture, air, or the like. The encapsulation substrate 500 may include a glass material or a polymer resin. For example, the encapsulation substrate 500 may include a glass material with $SiO_2$ as a main component thereof, or may include a resin, such as reinforced plastic. The encapsulation member 610 may be arranged to surround the display area DA in the peripheral area PA. The encapsulation member 610 may include a sealant or frit and be cured by heat and/or a laser beam, thereby bonding the encapsulation substrate 500 and the substrate 100 to each other.

A filling member 620 (e.g., a filler or filling layer) may be disposed between the substrate 100 and the encapsulation substrate 500. The filling member 620 may be disposed between the pixel layer 200 and the encapsulation substrate 500. The filling member 620 may protect the pixel layer 200 from a shock that may be applied from the outside and control a path of light emitted to the upper surface FS1 of the display apparatus 1'. The filling member 620 may include a transparent insulating material having a refractive index of about 1.4 to about 1.5. In some embodiments, the filling member 620 may include a urethane-based resin such as an organic sealant, an epoxy-based resin, an acryl-based resin, silicon that is an inorganic sealant, or the like. The urethane-based resin may include, for example, urethane acrylate or the like. The acryl-based resin may include, for example, butyl acrylate, ethylhexyl acrylate, or the like.

A light-shielding layer 700 may be disposed on a lower surface of the encapsulation substrate 500, e.g., a surface facing the substrate 100. The light-shielding layer 700 may at least partially absorb external light or internal reflected light. The light-shielding layer 700 may include a black pigment. The light-shielding layer 700 may include a black matrix. The light-shielding layer 700 may be arranged in the display area DA. The light-shielding layer 700 may include a transmissive area TA so that light emitted by a display element arranged in the display area DA passes to the outside of the light-shielding layer 700.

Figure 14:
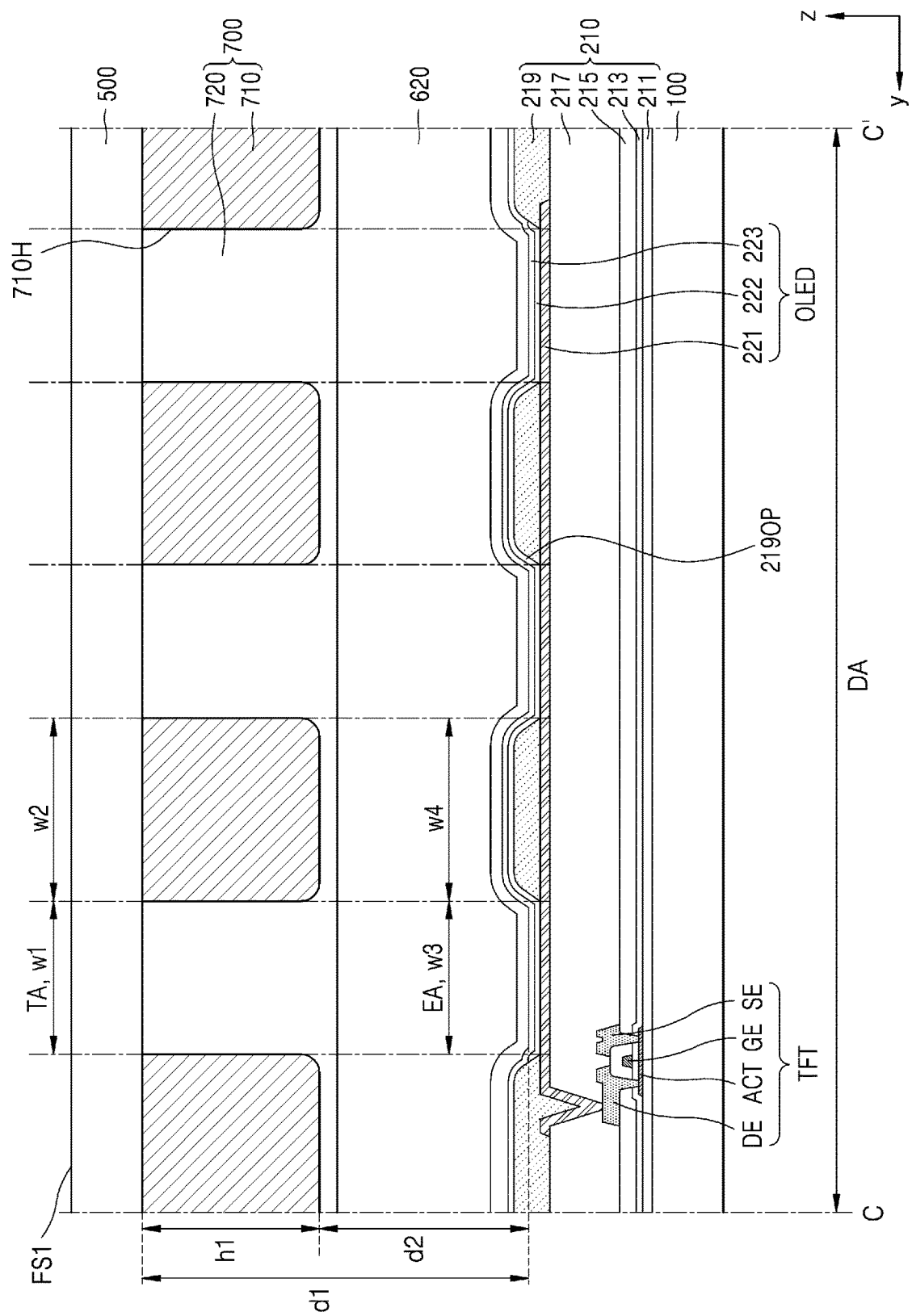
FIGS. 14 and 15 are cross-sectional views of a display apparatus according to embodiments.
Figure 15:
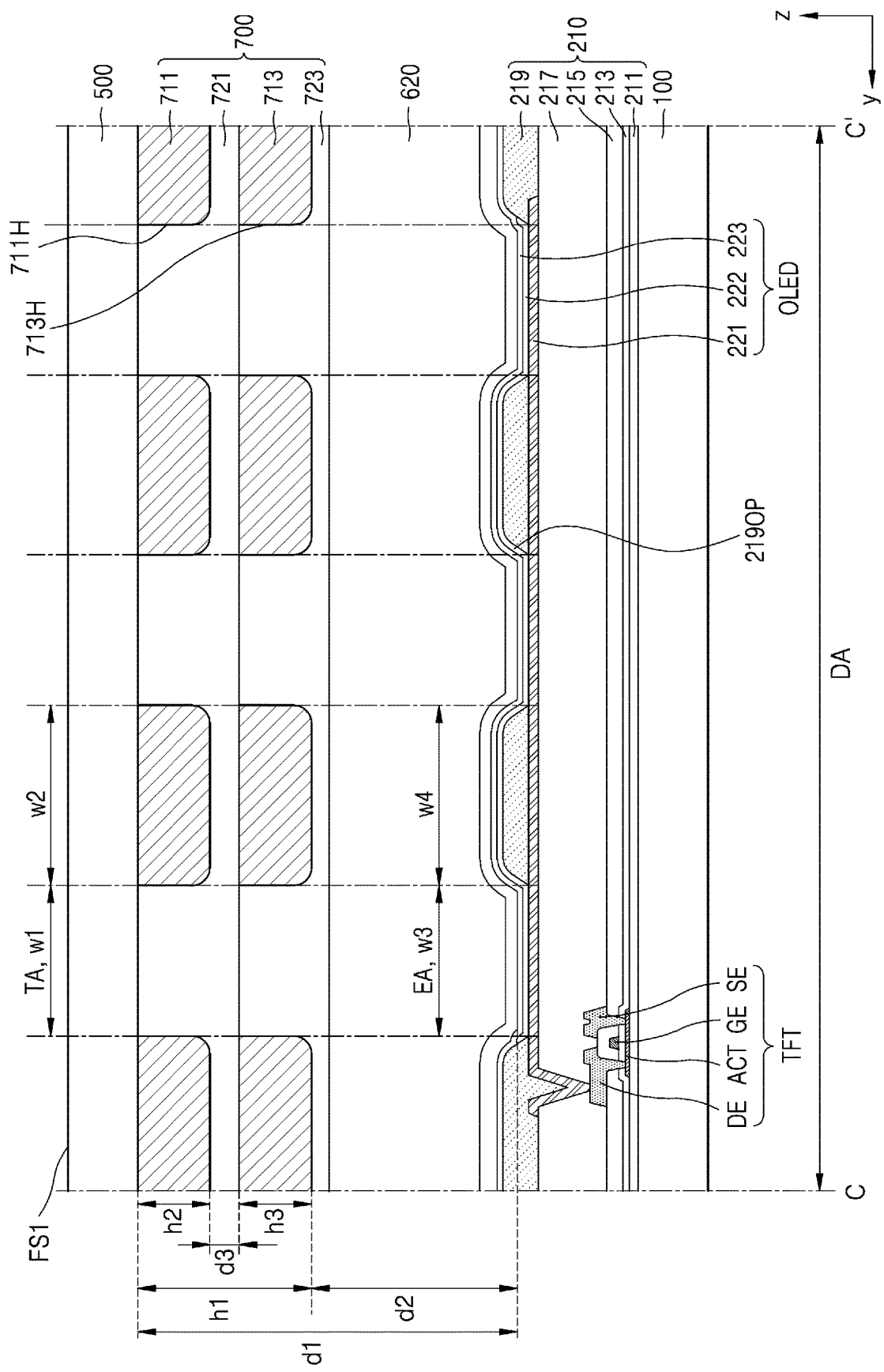

FIGS. 14 and 15 are cross-sectional views of a display apparatus 1' according to embodiments. A substrate 100, a pixel circuit layer 210, and an organic light-emitting diode OLED shown in FIGS. 14 and 15 may have a same or similar configuration as or to that of the substrate 100, the pixel circuit layer 210, and the organic light-emitting diode OLED shown in FIGS. 8 and 9, respectively. Thus, hereinafter, descriptions of the same or similar configurations are omitted, and differences are mainly described.

Referring to FIG. 14, the encapsulation substrate 500 may face the substrate 100 and be disposed over the organic light-emitting diode OLED that is a display element. In the present embodiment, the light-shielding layer 700 may be disposed on a lower surface of the encapsulation substrate 500, and include a light-shielding pattern 710 having a plurality of holes 710H, and a light-transmitting layer 720 which is under the light-shielding pattern 710 and defines a portion which is closer to the substrate 100 than the light-shielding pattern 710.

In an embodiment, the light-shielding layer 700 is in direct contact with the lower surface of the encapsulation substrate 500, but is not limited thereto. As being in contact (or direct contact), elements may form an interface with each other, without being limited thereto. An optical layer (not shown) having a different refractive index from those of the light-shielding layer 700 and the encapsulation substrate 500, may be further disposed between the light-shielding layer 700 and the encapsulation substrate 500.

The light-shielding pattern 710 may have the plurality of holes 710H overlapping the emission area EA of the organic light-emitting diode OLED. The holes 710H may include an area provided by removing a portion of the light-shielding pattern 710, and light emitted by a display element may be emitted to the outside through the hole 710H. In other words, the hole 710H of the light-shielding pattern 710 corresponds to a light-transmitting area TA in which light is emitted to the upper surface FS1 (see FIG. 12) of the display apparatus 1'.

Referring to FIG. 15, together with FIG. 5, each of the holes 710H of the light-shielding pattern 710 may have a polygonal shape of which edges extending in the second direction (e.g., the x direction) are round. A width of the hole 710H in the first direction (e.g., the y direction) may be less than a width of the hole 710H in the second direction (e.g., the x direction). In an embodiment, one hole 710H may overlap a plurality of pixels P that are apart from each other in the second direction (e.g., the x direction).

The plurality of holes 710H may be arranged apart from each other by a distance in the first direction (e.g., the y direction). In other words, solid portions as the light-shielding pattern 710 disposed between holes 710H that are adjacent to each other may have a second width w2 in the first direction (e.g., the y direction).

A single one of the hole 710H may overlap one or more openings 219OP that are arranged apart from each other in the second direction (e.g., the x direction). In an embodiment, the third width w3 of the opening 219OP in the first direction (e.g., the y direction) may be substantially equal to the first width w1 of the hole 710H in the first direction (e.g., the y direction). In a similar manner, the fourth width w4 of the pixel-defining layer 219 disposed between openings 219OP that are adjacent to each other may be substantially equal to the second width w2 of the light-shielding pattern 710 disposed between holes 710H that are adjacent to each other.

A filling member 620 may be disposed between the substrate 100 and the encapsulation substrate 500. In other words, the filling member 620 may fill a space between the organic light-emitting diode OLED and the light-shielding layer 700. A refractive index of the filling member 620 may be similar to a refractive index of the light-transmitting layer 720. In some embodiments, the refractive index of the filling material 620 may be between about 1.4 and about 1.5. When the refractive index of the filling member 620 is similar to the refractive index of the light-transmitting layer 720, the second width w2 of the light-shielding pattern 710 in the first direction (e.g., they direction) may be reduced so that an aperture ratio of the display apparatus 1 in the first direction (e.g., the y direction) may improve.

A first distance d1 from an upper surface of the emission area EA that is an area in which the organic light-emitting diode OLED emits light, to an upper surface of the light-shielding pattern 710 may be determined by the refractive index of the filling member 620, the refractive index of the light-transmitting layer 720, and the third width w3 of the opening 219OP. For example, when the refractive index of the light-transmitting layer 720 is about 1.4 to about 1.5, the first distance d1 from the upper surface of the emission area EA to the upper surface of the light-shielding pattern 710 may be about 2.6 to about 2.8 times the third width w3 of the opening 219OP. In this case, for light emitted from one emission area EA through the light-transmitting area TA corresponding to the emission area EA, an angle of the third direction (e.g., the z direction) perpendicular to the upper surface of the substrate to the first direction (e.g., the y direction) may be limited to about 30 degrees or less.

The second width w2, in the first direction (e.g., the y direction), of the light-shielding pattern 710 disposed between holes 710H adjacent to each other from among the plurality of holes 710H may be substantially equal to the fourth width w4, in the first direction (e.g., they direction), of the pixel-defining layer 219 disposed between openings 219OP adjacent to each other. In an embodiment, when the refractive index of the light-transmitting layer 720 is about 1.4 to about 1.5, the second width w2 of the light-shielding pattern 710 in the first direction (e.g., they direction) may be about 1.5 to about 1.7 times the third width w3 of the opening 219OP.

In order to block light emitted from a single one of the emission area EA through the light-transmitting areas TA neighboring each other in a plan view, a minimum thickness of the light-shielding pattern 710 may be determined. In an embodiment, when the refractive index of the light-transmitting layer 720 is about 1.5, a first thickness h1 of the light-shielding pattern 710 may be greater than about 0.8 times the second width w2, which is the width of the light-shielding pattern 710 in the first direction (e.g., the y direction).

A second distance d2 from the upper surface of the emission area EA to a lower surface of the light-shielding pattern 710 may be equal to a difference between the first distance d1 from the upper surface of the emission area EA to the upper surface to the light-shielding pattern 710, and a first thickness h1 of the light-shielding pattern 710. In other words, a thickness of the filling member 620 may be determined from the difference between the first distance d1 from the upper surface to the emission area EA to the upper surface of the light-shielding pattern 710 and the first thickness h1 of the light-shielding pattern 710.

The light-shielding pattern 710 may include a layer or layers. Regarding this, FIG. 14 shows the light-shielding pattern 710 that is a single one layer (e.g., monolayer), and FIG. 15 shows the light-shielding pattern 710 having a first sub-pattern 711 and a second sub-pattern 713.

The light-shielding pattern 710 may include a material that blocks most of light in a visible light area and may have a wavelength spectrum that generally absorbs a wavelength of about 380 nm to about 780 nm. In an embodiment, when the first thickness h1 of the light-shielding pattern 710 is at least about 0.8 times the second width w2 of the light-shielding pattern 710 in the first direction (e.g., the y direction), the display apparatus 1' may reduce a luminance of light having an angle of about 30 degrees or greater from the third direction (e.g., the z direction) perpendicular to the upper surface of the substrate 100 to the first direction (e.g., the y direction) without a separate optical film, and an aperture ratio in the first direction (e.g., the y direction) may be about 40% or greater. In an embodiment, when the first thickness h1 of the light-shielding pattern 710 is at least about 0.3 times the second width w2 of the light-shielding pattern 710 in the first direction (e.g., they direction), the display apparatus 1' may sufficiently reduce a luminance of light having an angle of about 30 degrees or greater from the third direction (e.g., the z direction) perpendicular to the upper surface of the substrate 100 to the first direction (e.g., the y direction) without a separate optical film, and an aperture ratio in the first direction (e.g., the y direction) may be about 60% or greater.

In order to constantly maintain the second width w2 of the light-shielding pattern 710, which is disposed between holes 710H adjacent to each other, in the first direction (e.g., they direction) and increase the first thickness h1 of the light-shielding pattern 710, the light-shielding pattern 710 may have a multi-layer structure including a plurality of sub-patterns as shown in FIG. 15. In an embodiment, the light-shielding pattern 710 may include the first sub-pattern 711 having a plurality of first sub-holes 711H and the second sub-pattern 713 having a plurality of second sub-holes 713H. A portion of a first light-transmitting layer 721 may be disposed under the first sub-pattern 711 and extend along a lower surface of the first sub-pattern 711. The first light-transmitting layer 721 may bury the first sub-holes 711H and cover a lower surface of the first sub-pattern 711. A portion of the second sub-pattern 713 may be disposed under the first light-transmitting layer 721. The plurality of second sub-holes 713H of the second sub-pattern 713 may be arranged to overlap the plurality of first sub-holes 711H of the first sub-pattern 711. A total thickness of the light-shielding pattern 710 may be equal to a first thickness h1 from an upper surface of the first sub-pattern 711 to a lower surface of the second sub-pattern 713. Therefore, when the first light-transmitting layer 721 is disposed between the first sub-pattern 711 and the second sub-pattern 713, each of a second thickness h2 of the first sub-pattern 711 and a third thickness h3 of the second sub-pattern 713 may be less than or equal to about 0.8 times the second width w2 of the light-shielding pattern 710 in the first direction (e.g., the y direction).

In order to provide a display apparatus 1' according to an embodiment, the following process may be performed.

The light-shielding layer 700 may be provided by applying an organic material onto the lower surface of the encapsulation substrate 500 and performing a photopatterning process or an inkjet process. The filling member 620 may be provided to fill the space between the organic light-emitting diode OLED and the light-shielding layer 700. In some embodiments, the filling member 620 may be applied before the substrate 100 on which the organic light-emitting diode OLED is provided and the encapsulation substrate 500 on which the light-shielding layer 700 is provided are bonded to each other, and then, the substrate 100 and the encapsulation substrate 500 may be bonded to the encapsulation member 610.

According to an embodiment configured as described above, a display apparatus 1 (or display apparatus 1') having a high aperture ratio while a viewing angle is limited in one direction may be provided. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope included in the following claims.

What is claimed is:

1. A display apparatus comprising:
a display element layer which comprises a plurality of emission areas spaced apart from each other;
each emission area among the plurality of emission areas having a first length in a first direction, and a second length in a second direction crossing the first direction;
an encapsulation layer over the display element layer; and
a light-shielding pattern layer which is over the encapsulation layer and defines a plurality of holes respectively corresponding to the plurality of emission areas of the display element layer, the plurality of holes spaced apart from each other along the second direction by a distance along the second direction,
wherein
the display element layer has an upper surface at the emission area,
the light-shielding pattern layer has an upper surface furthest from the display element layer,
a distance from the upper surface of the display element layer at the emission area, to the upper surface of the light-shielding pattern layer, along a thickness direction of the display apparatus, is about 2.6 to about 2.8 times the second length of the emission area, and
the distance between the plurality of holes of the light-shielding pattern layer is about 1.5 to about 1.7 times the second length of the emission area.

2. The display apparatus of claim 1, wherein a thickness of the light-shielding pattern layer along the thickness direction of the display apparatus is greater than about 0.8 times the distance between the plurality of holes of the light-shielding pattern layer.

3. The display apparatus of claim 1, wherein the first length of the emission area is greater than the second length of the emission area.

4. The display apparatus of claim 1, wherein the first length of the emission area is greater than about three times the second length of the emission area.

5. The display apparatus of claim 1, wherein the display element layer further comprises:
   a pixel-defining layer which defines a plurality of openings respectively corresponding to the plurality of emission areas of the display element layer;
   a pixel electrode overlapping at least one of the plurality of openings in the pixel-defining layer;
   an emission layer over the pixel electrode; and
   an opposite electrode over the emission layer.

6. The display apparatus of claim 5, wherein the plurality of openings in the pixel-defining layer are located within an edge of the pixel electrode, in a plan view.

7. The display apparatus of claim 5, wherein
   the pixel electrode is provided in plurality including a plurality of pixel electrodes,
   the plurality of pixel electrodes comprise a first pixel electrode and a second pixel electrode which is spaced apart from the first pixel electrode along the first direction,
   the plurality of openings of the pixel-defining layer comprise a first opening corresponding to the first pixel electrode, and a second opening corresponding to the second pixel electrode, and
   a same one hole among the plurality of holes of the light-shielding pattern layer corresponds to both the first opening and the second opening of the pixel-defining layer.

8. The display apparatus of claim 5, wherein
   the pixel electrode has a comb-shape comprising a connection portion extending along the second direction, and a plurality of protrusions which each protrude from the connection portion and extend along the first direction, and
   the plurality of openings of the pixel-defining layer correspond to the plurality of protrusions of the pixel electrode, respectively.

9. The display apparatus of claim 1, further comprising a light-transmitting layer which is over the light-shielding pattern layer and fills the plurality of holes in the light-shielding pattern layer,
   wherein a refractive index of the light-transmitting layer is about 1.4 to about 1.5.

10. The display apparatus of claim 1, wherein the light-shielding pattern layer is provided in plural including:
    a first light-shielding pattern layer which defines a plurality of first sub-holes respectively corresponding to the plurality of emission areas of the display element layer, and
    a second light-shielding pattern layer which defines a plurality of second sub-holes respectively corresponding to the plurality of the first sub-holes.

11. A display apparatus comprising:
    a display element layer which comprises a plurality of emission areas spaced apart from each other;
    each emission area among the plurality of emission areas having a first length in a first direction, and a second length in a second direction crossing the first direction;
    an encapsulation substrate facing the display element layer;
    a filling layer between the display element layer and the encapsulation substrate; and
    a light-shielding pattern layer which is between the encapsulation substrate and the filling layer and defines a plurality of holes respectively corresponding to the plurality of emission areas of the display element layer, the plurality of holes spaced apart from each other along the second direction by a distance along the second direction,
    wherein
    the display element layer has an upper surface at the emission area,
    the light-shielding pattern layer has an upper surface furthest from the display element layer,
    a distance from the upper surface of the display element layer at the emission area, to the upper surface of the light-shielding pattern layer, along a thickness direction of the display apparatus, is about 2.6 to about 2.8 times the second length of the emission area, and
    the distance between the plurality of holes of the light-shielding pattern layer is about 1.5 to about 1.7 times the second length of the emission area.

12. The display apparatus of claim 11, wherein a thickness of the light-shielding pattern layer along the thickness direction of the display apparatus is greater than about 0.8 times the distance between the plurality of holes of the light-shielding pattern layer.

13. The display apparatus of claim 11, wherein the first length of the emission area is greater than the second length of the emission area.

14. The display apparatus of claim 11, wherein the first length of the emission area is greater than about three times the second length of the emission area.

15. The display apparatus of claim 11, wherein the display element layer further comprises:
    a pixel-defining layer which defines a plurality of openings respectively corresponding to the plurality of emission areas of the display element layer;
    a pixel electrode overlapping at least one of the plurality of openings in the pixel-defining layer;
    an emission layer over the pixel electrode; and
    an opposite electrode over the emission layer.

16. The display apparatus of claim 15, wherein, in a plan view, the plurality of openings in the pixel-defining layer are located within an edge of the pixel electrode.

17. The display apparatus of claim 15, wherein
    the pixel electrode is provided in plurality including a plurality of pixel electrodes,
    the plurality of pixel electrodes comprise a first pixel electrode and a second pixel electrode which is spaced apart from the first pixel electrode along the first direction,
    the plurality of openings of the pixel-defining layer comprise a first opening corresponding to the first pixel electrode and a second opening corresponding to the second pixel electrode, and
    a same one hole among the plurality of holes of the light-shielding pattern layer corresponds to both the first opening and the second opening of the pixel-defining layer.

18. The display apparatus of claim 15, wherein
    the pixel electrode has a comb-shape comprising a connection portion extending along the second direction, and a plurality of protrusions which each protrude from the connection portion and extend along the first direction, and
    the plurality of openings of the pixel-defining layer correspond to the plurality of protrusions of the pixel electrode, respectively.

19. The display apparatus of claim 11, wherein a refractive index of the filling layer is about 1.4 to about 1.5.

20. The display apparatus of claim 11, wherein the light-shielding pattern layer is provided in plural including:
- a first light-shielding pattern layer which defines a plurality of first sub-holes respectively corresponding to the plurality of emission areas of the display element layer, and
- a second light-shielding pattern layer which defines a plurality of second sub-holes respectively corresponding to the plurality of the first sub-holes.

\* \* \* \* \*